(12) United States Patent
Sugakawa et al.

(10) Patent No.: US 9,741,595 B2
(45) Date of Patent: Aug. 22, 2017

(54) BONDING METHOD, STORAGE MEDIUM, BONDING APPARATUS AND BONDING SYSTEM

(71) Applicant: TOKYO ELECTRON LIMITED, Tokyo (JP)

(72) Inventors: Kenji Sugakawa, Koshi (JP); Yuji Mimura, Koshi (JP); Shuhei Matsumoto, Koshi (JP); Takahiro Masunaga, Koshi (JP); Makoto Tsukishima, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 106 days.

(21) Appl. No.: 14/950,281

(22) Filed: Nov. 24, 2015

(65) Prior Publication Data
US 2016/0155721 A1  Jun. 2, 2016

(30) Foreign Application Priority Data
Nov. 27, 2014 (JP) ................................ 2014-240240

(51) Int. Cl.
*H01L 21/67* (2006.01)
*H01L 21/66* (2006.01)
(Continued)

(52) U.S. Cl.
CPC .. *H01L 21/67248* (2013.01); *H01L 21/67092* (2013.01); *H01L 21/681* (2013.01); *H01L 22/20* (2013.01); *H01L 24/75* (2013.01); *H01L 24/80* (2013.01); *H01L 24/94* (2013.01); *H01L 21/8221* (2013.01); *H01L 22/12* (2013.01); *H01L 24/08* (2013.01); *H01L 2224/08145* (2013.01); *H01L 2224/7501* (2013.01); *H01L 2224/759* (2013.01); *H01L 2224/7565* (2013.01); *H01L 2224/75251* (2013.01); *H01L 2224/75252* (2013.01); *H01L 2224/75301* (2013.01); *H01L 2224/75601* (2013.01);
(Continued)

(58) Field of Classification Search
CPC ......... H01L 21/67248; H01L 21/67092; H01L 21/681; H01L 22/20; H01L 24/75; H01L 24/80; H01L 24/94
See application file for complete search history.

(56) References Cited

FOREIGN PATENT DOCUMENTS

| JP | 2012-175043 | * | 9/2012 |
| JP | 2012-175043 A | | 9/2012 |

* cited by examiner

*Primary Examiner* — Karen Kusumakar
(74) *Attorney, Agent, or Firm* — Nath, Goldberg & Meyer; Jerald L. Meyer

(57) ABSTRACT

There is provided a method of bonding substrates to each other, which includes: holding a first substrate on a lower surface of a first holding part; adjusting a temperature of a second substrate by a temperature adjusting part to become higher than a temperature of the first substrate; holding the second substrate on an upper surface of a second holding part; inspecting a state of the second substrate by imaging a plurality of reference points of the second substrate with a first imaging part, measuring positions of the reference points, and comparing a measurement result with a predetermined permissible range; and pressing a central portion of the first substrate with a pressing member, bringing the central portion of the first substrate into contact with a central portion of the second substrate, and sequentially bonding the first substrate and the second substrate.

12 Claims, 16 Drawing Sheets

(51) Int. Cl.
 H01L 23/00 (2006.01)
 H01L 21/68 (2006.01)
 H01L 21/822 (2006.01)
(52) U.S. Cl.
 CPC ............ *H01L 2224/75702* (2013.01); *H01L 2224/75704* (2013.01); *H01L 2224/75705* (2013.01); *H01L 2224/75744* (2013.01); *H01L 2224/75745* (2013.01); *H01L 2224/75753* (2013.01); *H01L 2224/75802* (2013.01); *H01L 2224/75804* (2013.01); *H01L 2224/75822* (2013.01); *H01L 2224/75823* (2013.01); *H01L 2224/75824* (2013.01); *H01L 2224/75981* (2013.01); *H01L 2224/80003* (2013.01); *H01L 2224/80013* (2013.01); *H01L 2224/8013* (2013.01); *H01L 2224/80048* (2013.01); *H01L 2224/80132* (2013.01); *H01L 2224/80201* (2013.01); *H01L 2224/80894* (2013.01); *H01L 2224/80908* (2013.01); *H01L 2224/83201* (2013.01); *H01L 2224/94* (2013.01)

BONDING METHOD, STORAGE MEDIUM, BONDING APPARATUS AND BONDING SYSTEM

CROSS-REFERENCE TO RELATED APPLICATION

This application claims the benefit of Japanese Patent Application No. 2014-240240, filed on Nov. 27, 2014, in the Japan Patent Office, the disclosure of which is incorporated herein in its entirety by reference.

TECHNICAL FIELD

The present disclosure relates to a bonding method of bonding substrates to each other, a storage medium, a bonding apparatus and a bonding system.

BACKGROUND

In recent years, semiconductor devices have been under high integration. When a plurality of highly-integrated semiconductor devices is arranged in a horizontal plane and are connected by wirings for final fabrication, there are problems of increase in wiring length, wiring resistance and wiring delay.

Under the circumstances, there has been proposed a three-dimensional integration technique for stacking semiconductor devices in three dimensions. This three-dimensional integration technique uses a bonding system to bond two semiconductor wafers (hereinafter abbreviated as "wafers") together. For example, the bonding system includes a surface modifying device (surface activating device) for modifying bonding surfaces of the wafers, a surface hydrophilizing device for hydrophilizing the surfaces of the wafers modified by the surface modifying device and a bonding device for bonding the wafers having the surfaces hydrophilized by the surface hydrophilizing device. In this bonding system, the surface modifying device modifies the wafer surfaces by plasma-processing the wafer surfaces and the surface hydrophilizing device hydrophilizes the wafer surfaces by supplying pure water onto the wafer surfaces. Then, the bonding device bonds the wafers using a Van der Waals force and hydrogen bonding (an intermolecular force).

The bonding apparatus includes an upper chuck configured to hold one wafer (hereinafter referred to as an "upper wafer") on a lower surface thereof, a lower chuck installed below the upper chuck and configured to hold another wafer (hereinafter referred to as a "lower wafer") on an upper surface thereof, and a pressing member installed in the upper chuck and configured to press a central portion of the upper wafer. In this bonding apparatus, the upper wafer held by the upper chuck and the lower wafer held by the lower chuck are disposed to face each other. In this state, the central portion of the upper wafer is pressed by the pressing member to bring the central portion of the upper wafer into contact with a central portion of the lower wafer. Thereafter, in the state in which the central portion of the upper wafer and the central portion of the lower wafer make contact with each other, the upper wafer and the lower wafer are bonded sequentially from the central portion of the upper wafer toward the outer peripheral portion thereof.

However, in such a method, the central portion of the upper wafer is moved down toward the central portion of the lower wafer by the pressing member, while holding the outer peripheral portion of the upper wafer by the upper chuck. Thus, the upper wafer is warped and stretched in a downwardly convex shape. In this case, when bonding the wafers to each other, the upper wafer and the lower wafer may sometimes be bonded in a horizontally shifted state. For example, even if the central portion of the upper wafer and the central portion of the lower wafer are aligned with each other in the bonded wafer (hereinafter referred to as an "overlapped wafer"), a horizontal position deviation (scaling) is generated in the outer peripheral portions of the upper wafer and the lower wafer.

In order to suppress deterioration of the scaling, the present inventors have conceived that the lower wafer is expanded by adjusting a temperature thereof prior to holding the lower wafer with the lower chuck. That is to say, even if the upper wafer is warped and stretched in the downwardly convex shape by the pressing member, no problem is generated if the lower wafer is expanded just as much as the stretched amount of the upper wafer. In this case, when bonding the upper wafer and the lower wafer, diameters of the upper wafer and the lower wafer become equal to each other. It is therefore possible to suppress the horizontal position deviation of the outer peripheral portions.

In an effort to verify the effect of the scaling countermeasure, the present inventors have inspected an actually-bonded overlapped wafer using an inspection device separately installed outside the bonding apparatus. However, the inspection has shown that the scaling still occurs and the overlapped wafer is wasted. This results in deterioration in the product yield. Furthermore, if the inspection is performed by the inspection device installed outside the bonding apparatus, the inspection is time-consuming and costly. Accordingly, there is room for improvement in the conventional wafer bonding process.

SUMMARY

Some embodiments of the present disclosure provide a technique capable of properly inspecting and adjusting horizontal positions of substrates to be bonded to each other, thus properly performing a substrate bonding process.

According to one embodiment of the present disclosure, there is provided a method of bonding substrates to each other, including: a first holding operation of holding a first substrate on a lower surface of a first holding part; a temperature adjusting operation of adjusting a temperature of a second substrate by a temperature adjusting part to become higher than a temperature of the first substrate; a second holding operation of holding the second substrate temperature-adjusted at the temperature adjusting operation on an upper surface of a second holding part; an inspecting operation of inspecting a state of the second substrate by imaging a plurality of reference points of the second substrate held in the second holding part with a first imaging part, measuring positions of the reference points, and comparing a measurement result with a predetermined permissible range; and a bonding operation of, if the state of the second substrate is determined to be normal at the inspecting operation, pressing a central portion of the first substrate with a pressing member, bringing the central portion of the first substrate into contact with a central portion of the second substrate, and sequentially bonding the first substrate and the second substrate from the central portion of the first substrate toward an outer peripheral portion thereof.

According to another embodiment of the present disclosure, there is provided a non-transitory computer-readable storage medium storing a program which, when executed by a computer of a control part that controls a bonding apparatus, causes the bonding apparatus to perform the aforementioned bonding method.

According to yet another embodiment of the present disclosure, there is provided an apparatus of bonding substrates to each other, including: a first holding part configured to hold a first substrate on a lower surface thereof; a second holding part installed below the first holding part and configured to hold a second substrate on an upper surface thereof; a pressing member installed in the first holding part and configured to press a central portion of the first substrate; a temperature adjusting part configured to adjust a temperature of the second substrate; a first imaging part configured to image the second substrate held by the second holding part; and a control part configured to control the first holding part, the second holding part, the pressing member, the temperature adjusting part and the first imaging part so as to perform: a first holding operation of holding the first substrate on the lower surface of the first holding part; a temperature adjusting operation of adjusting the temperature of the second substrate by the temperature adjusting part to become higher than a temperature of the first substrate; a second holding operation of holding the second substrate temperature-adjusted at the temperature adjusting operation on the upper surface of the second holding part; an inspecting operation of inspecting a state of the second substrate by imaging a plurality of reference points of the second substrate held in the second holding part with the first imaging part; measuring positions of the reference points and comparing a measurement result with a predetermined permissible range; and a bonding operation of, if the state of the second substrate is determined to be normal at the inspecting operation, pressing the central portion of the first substrate with the pressing member, bringing the central portion of the first substrate into contact with a central portion of the second substrate and sequentially bonding the first substrate and the second substrate from the central portion of the first substrate toward an outer peripheral portion thereof.

According to still another embodiment of the present disclosure, there is provided a bonding system provided with the aforementioned bonding apparatus, including: a processing station including the bonding apparatus; and a carry-in/carry-out station configured to hold a plurality of first substrates, a plurality of second substrates or a plurality of overlapped substrates each of which obtained by bonding the first substrate and the second substrate and configured to carry the first substrates, the second substrates or the overlapped substrates into and out of the processing station, wherein the processing station includes: a surface modifying apparatus configured to modify a front surface of the first substrate or a front surface of the second substrate; a surface hydrophilizing apparatus configured to hydrophilize the front surface of the first substrate or the front surface of the second substrate modified in the surface modifying apparatus; and a transfer device configured to transfer the first substrate, the second substrate or the overlapped surface between the surface modifying apparatus, the surface hydrophilizing apparatus and the bonding apparatus, wherein the bonding apparatus bonds the first substrate and the second substrate whose front surfaces are hydrophilized by the surface hydrophilizing apparatus.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
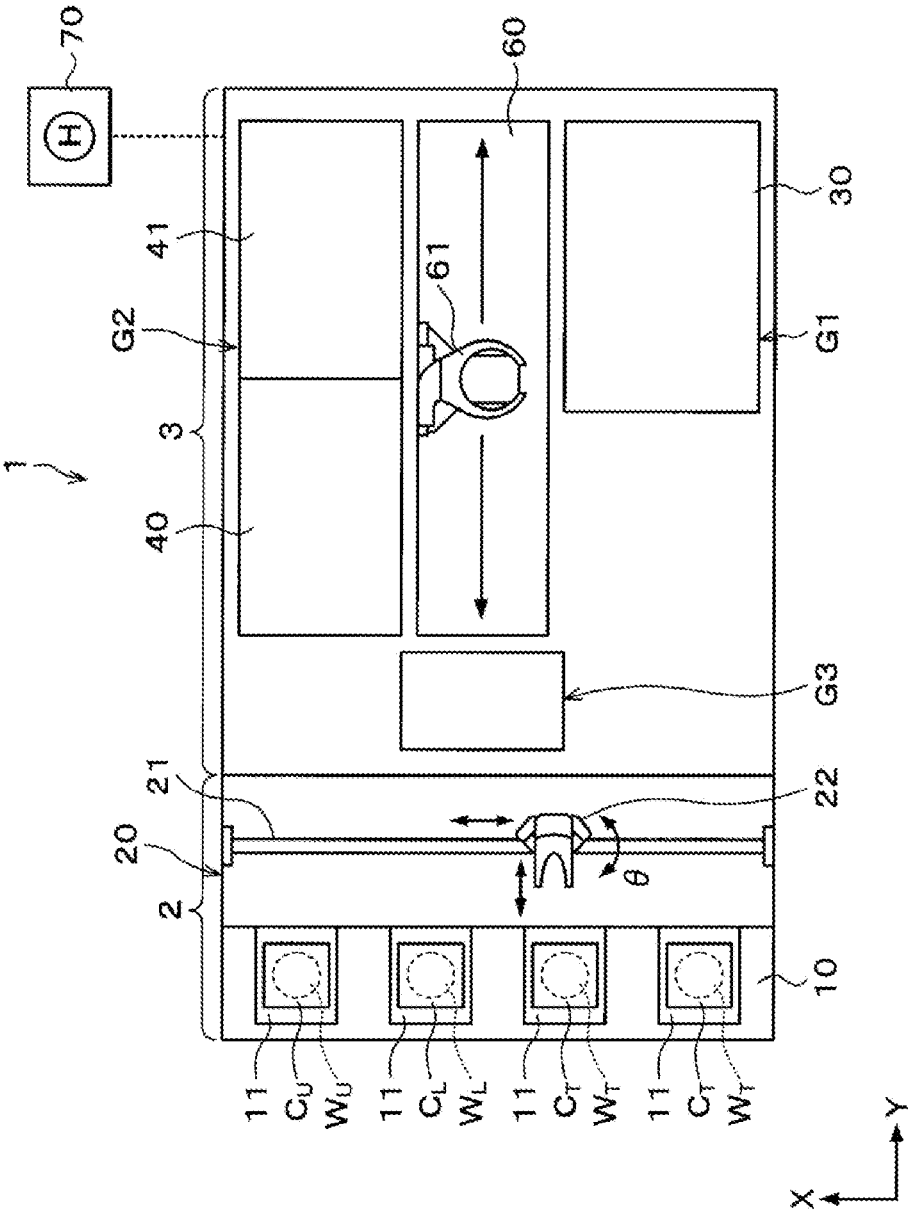
FIG. 1 is a plan view schematically showing a configuration of a bonding system according to one embodiment of the present disclosure.

Reference will now be made in detail to various embodiments, examples of which are shown in the accompanying drawings. In the drawings, like reference numerals denote like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 2:
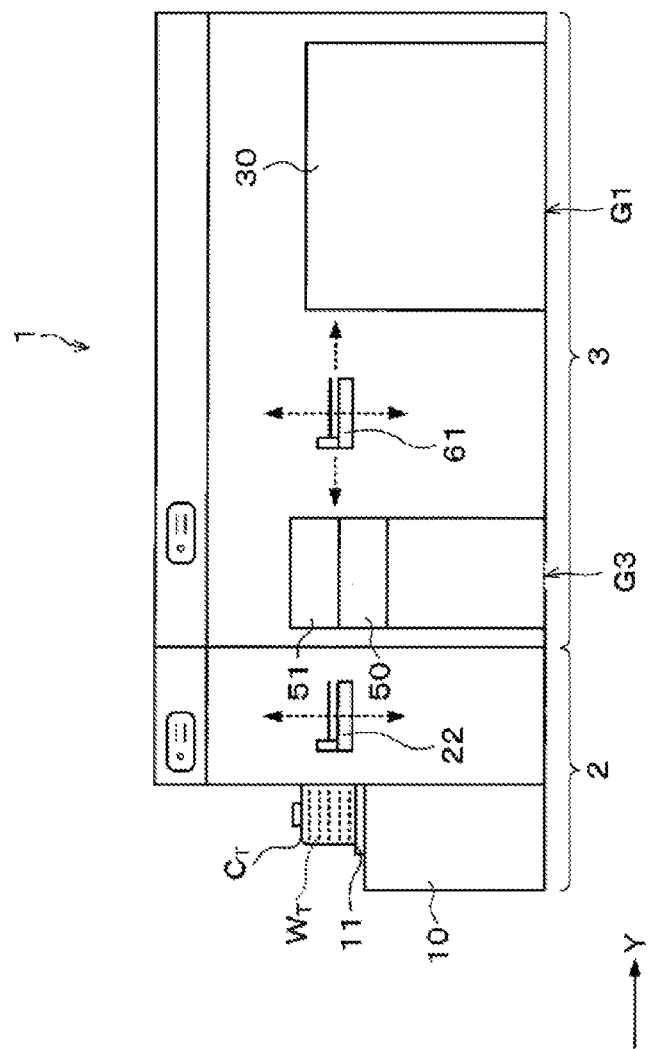
FIG. 2 is a side view schematically showing an internal configuration of the bonding system according to one embodiment of the present disclosure.

FIG. 1 is a plan view schematically showing a configuration of a bonding system 1 according to one embodiment of the present disclosure. FIG. 2 is a side view schematically showing an internal configuration of the bonding system 1.

Figure 3:
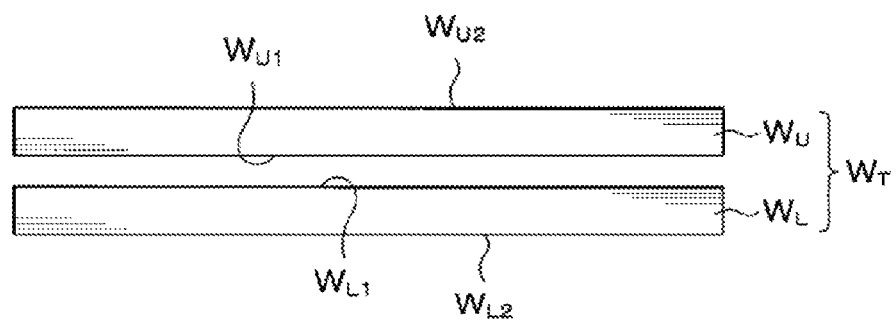
FIG. 3 is a side view schematically showing configurations of an upper wafer and a lower wafer.

The bonding system 1 is used to bond two substrates, for example, wafers $W_U$ and $W_L$, as shown in FIG. 3. In the following description, a wafer disposed at an upper side will be referred to as an "upper wafer $W_U$" used as a first substrate. A wafer disposed at a lower side will be referred to as a "lower wafer $W_L$" used as a second substrate. Moreover, a bonding surface of the upper wafer $W_U$ bonded to the lower wafer $W_L$ will be referred to as a "front surface $W_{U1}$". A surface opposite to the front surface $W_{U1}$ will be referred to as a "rear surface $W_{U2}$". Similarly, a bonding surface of the lower wafer $W_L$ bonded to the upper wafer $W_U$ will be referred to as a "front surface $W_{L1}$". A surface opposite to the front surface $W_{L1}$ will be referred to as a "rear surface $W_{L2}$". In addition, in the bonding system 1, an overlapped wafer $W_T$ used as an overlapped substrate is formed by bonding the upper wafer $W_U$ and the lower wafer $W_L$.

As shown in FIG. 1, the bonding system 1 includes a carry-in/carry-out station 2 and a processing station 3 which are serially connected to each other. Cassettes $C_U$, $C_L$, and $C_T$ respectively capable of accommodating a plurality of wafers $W_U$ and $W_L$ and a plurality of overlapped wafers $W_T$ are carried in and out between the carry-in/carry-out station 2 and the outside. The processing station 3 includes different kinds of processing apparatuses which are configured to perform a predetermined processes with respect to the wafers $W_U$ and $W_L$ and the overlapped wafers $W_T$.

A cassette mounting table 10 is disposed in the carry-in/carry-out station 2. A plurality of (e.g., four) cassette mounting boards 11 is installed on the cassette mounting table 10. The cassette mounting boards 11 are arranged in a line along an X-axis direction (vertical direction in FIG. 1). The cassette mounting boards 11 can mount thereon the cassettes $C_W$, $C_S$ and $C_T$, when they are carried in and out between the carry-in/carry-out station 2 and the outside of the bonding system 1, respectively. In this way, the carry-in/carry-out station 2 can hold the plurality of upper wafers $W_U$, the plurality of lower wafers $W_L$ and the plurality of overlapped wafers $W_T$. The number of the cassette mounting boards 11 is not limited to this embodiment but may be selected as appropriate. One of the cassettes may be used as a collection cassette for collecting defective wafers. That is to say, the collection cassette is provided to receive the defective wafers having a defect due to various factors in the bonding of the upper wafer $W_U$ and the lower wafer $W_L$, except normal overlapped wafers T. In this embodiment, one of the plurality of cassettes $C_T$ is used as the collection cassette for collecting the defective wafers and the other cassette $C_T$ is used to receive the normal overlapped wafers T.

In the carry-in/carry-out station 2, a wafer transfer section 20 is installed adjacent to the cassette mounting table 10. A wafer transfer device 22 which is movable along a transfer path 21 extending in the X-axis direction is installed in the wafer transfer section 20. The wafer transfer device 22 is movable in a vertical direction and is rotatable about a vertical axis (in a θ direction). The wafer transfer device 22 is configured to transfer the upper wafer $W_U$, the lower wafer $W_L$ and the overlapped wafer $W_T$ between the cassettes $C_U$, $C_L$ and $C_T$ mounted on the respective cassette mounting boards 11 and transition devices 50 and 51 of a third processing block G3 of the processing station 3, which will be described later.

A plurality of (e.g., three) processing blocks G1, G2 and G3 including various kinds of apparatuses is installed in the processing station 3. For example, the first processing block G1 is installed at a front side of the processing station 3 (at a backward side in the X-axis direction in FIG. 1). The second processing block G2 is installed at a back side of the processing station 3 (at a forward side in the X-axis direction in FIG. 1). The third processing block G3 is installed adjacent to the carry-in/carry-out station 2 in the processing station 3 (at a backward side in a Y-axis direction in FIG. 1).

For example, a surface modifying apparatus 30 configured to modify the front surfaces $W_{U1}$ and $W_{L1}$ of the upper and lower wafers $W_U$ and $W_L$ is disposed in the first processing block G1. In the surface modifying apparatus 30, an oxygen gas or a nitrogen gas used as a process gas is excited, converted to plasma and ionized under, e.g., a depressurized environment. Oxygen ions or nitrogen ions thus generated are irradiated on the front surfaces $W_{U1}$ and $W_{L1}$, whereby the front surfaces $W_{U1}$ and $W_{L1}$ are plasma-processed and modified.

For example, in the second processing block G2, a surface hydrophilizing apparatus 40 configured to hydrophilize and clean the front surfaces $W_{U1}$ and $W_{L1}$ of the upper and lower wafers $W_U$ and $W_L$ with, e.g., pure water, and a bonding apparatus 41 configured to bond the upper and lower wafers $W_U$ and $W_L$, are arranged side by side along the horizontal Y-axis direction in the named order from the side of the carry-in/carry-out station 2.

The surface hydrophilizing apparatus 40 supplies the pure water onto the upper and lower wafers $W_U$ and $W_L$ while rotating the upper and lower wafers $W_U$ and $W_L$ held in, e.g., a spin chuck. Then, the supplied pure water is diffused on the front surfaces $W_{U1}$ and $W_{L1}$ of the upper and lower wafers $W_U$ and $W_L$, whereby the front surfaces $W_{U1}$ and $W_{L1}$ are hydrophilized A configuration of the bonding apparatus 41 will be described later.

For example, in the third processing block G3, transition devices 50 and 51 for the upper and lower wafers $W_U$ and $W_L$ and the overlapped wafers $W_T$ are installed in two stages one above another from below as shown in FIG. 2.

As shown in FIG. 1, a zone surrounded by the first processing block G1, the second processing block G2 and the third processing block G3 is defined as a wafer transfer zone 60. For example, a wafer transfer device 61 is arranged in the wafer transfer zone 60.

The wafer transfer device 61 includes a transfer arm which is movable in a vertical direction and the horizontal directions (the Y-axis direction and the X-axis direction) and is rotatable about the vertical axis. The wafer transfer device 61 moves within the wafer transfer zone 60 to transfer the upper and lower wafers $W_U$ and $W_L$ and the overlapped wafer $W_T$ to a specified apparatus installed within the first processing block G1, the second processing block G2 or the third processing block G3 disposed around the wafer transfer zone 60.

As shown in FIG. 1, the bonding system 1 includes a control part 70. The control part 70 is, e.g., a computer, and is provided with a program storage part (not shown). The program storage part stores a program that controls the processing of the upper and lower wafers $W_U$ and $W_L$ and the overlapped wafer $W_T$ performed in the bonding system 1. Furthermore, the program storage part stores a program for controlling the operations of various kinds of processing apparatuses described above and the operations of drive systems such as the transfer device and the like and for realizing the below-mentioned wafer bonding process in the bonding system 1. The aforementioned programs are recorded in a computer-readable storage medium H such as, e.g., a hard disc (HD), a flexible disc (FD), a compact disc (CD), a magneto-optical disc (MO) or a memory card. The programs may be downloaded from the storage medium H and installed in the control part 70.

Figure 4:
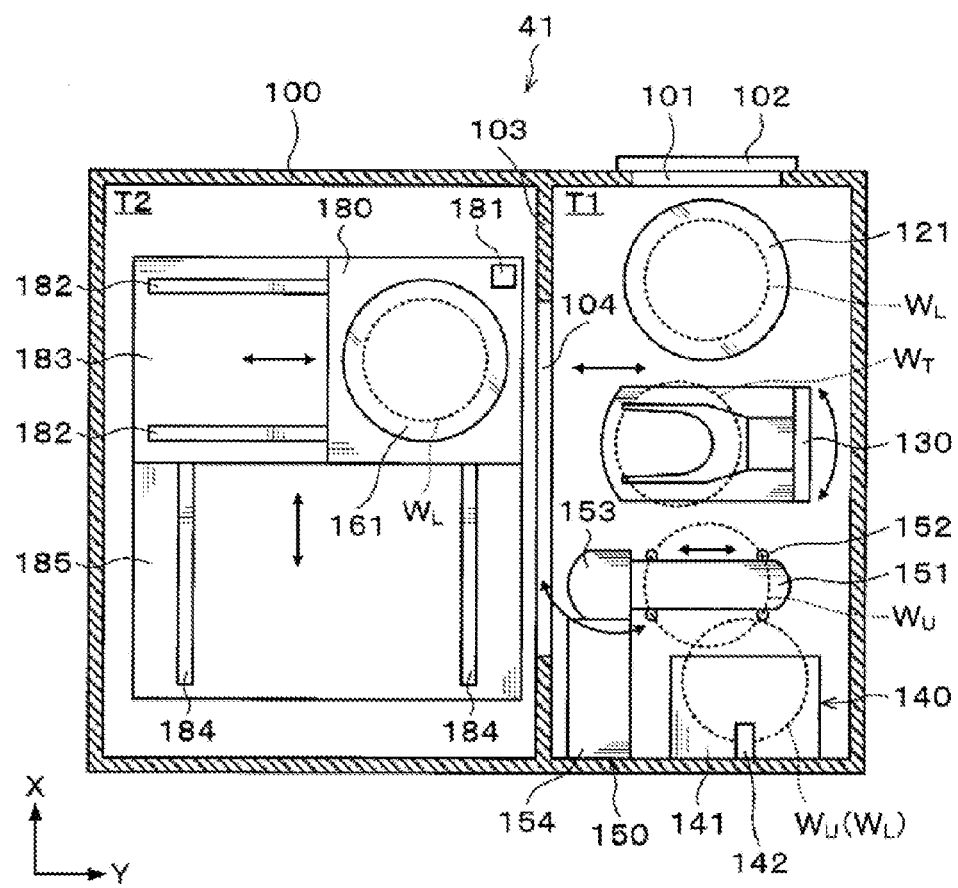
FIG. 4 is a horizontal sectional view schematically showing a configuration of a bonding apparatus.
Figure 5:
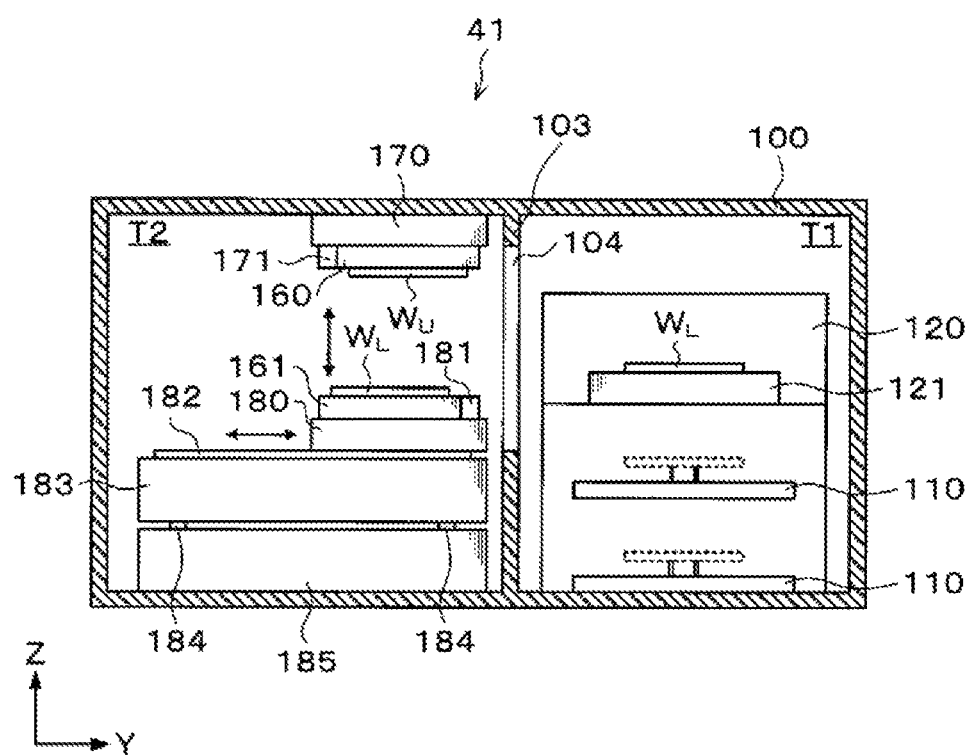
FIG. 5 is a vertical sectional view schematically showing the configuration of the bonding apparatus.
Figure 6:
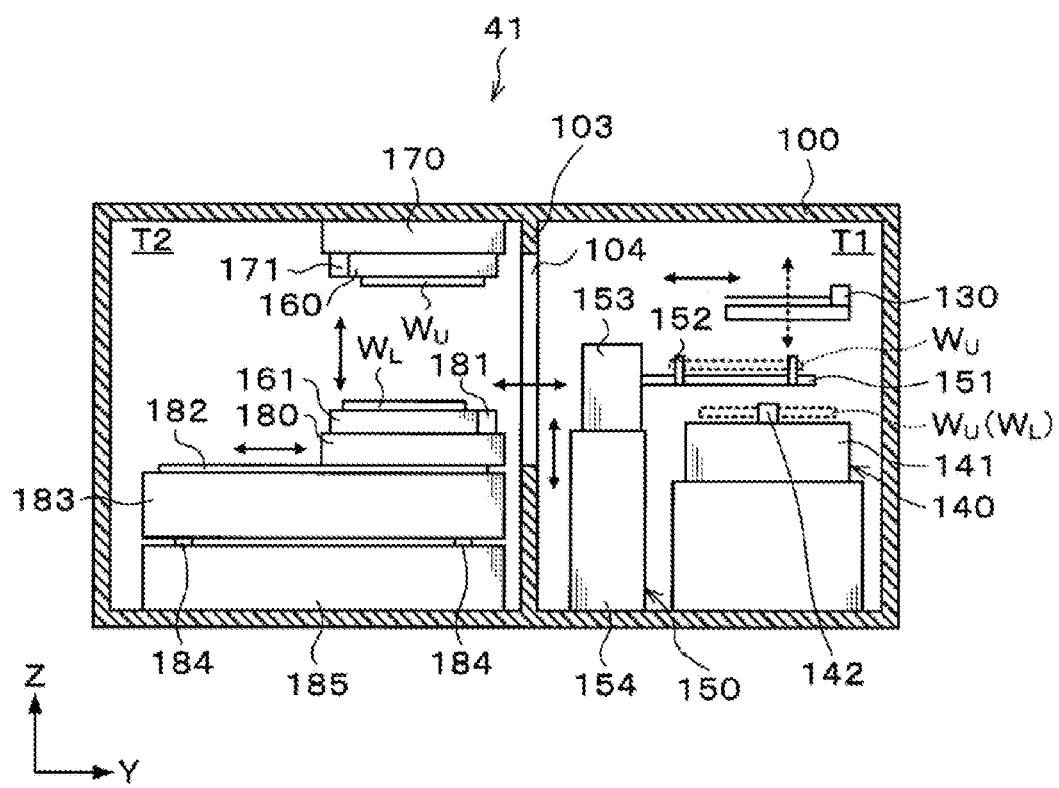
FIG. 6 is a vertical sectional view schematically showing the configuration of the bonding apparatus.

Next, a description will be made on a configuration of the bonding apparatus 41. As shown in FIGS. 4 to 6, the bonding apparatus 41 includes an internally-sealable processing vessel 100. An inlet/outlet 101 through which the upper and lower wafers $W_U$ and $W_L$ and the overlapped wafer $W_T$ are transferred, is formed in a side adjacent to the wafer transfer zone 60 in the processing vessel 100. An opening/closing shutter 102 is installed in the inlet/outlet 101.

The interior of the processing vessel 100 is divided into a transfer region T1 and a processing region T2 by an internal wall 103. The inlet/outlet 101 is formed in a side surface of the processing vessel 100 in the transfer region T1. A inlet/outlet 104 through which the upper and lower wafers $W_U$ and $W_L$ and the overlapped wafer $W_T$ are transferred, is also formed in the internal wall 103.

At the forward side of the X-axis direction in the transfer region T1, transitions 110 configured to temporarily mount the upper and lower wafers $W_U$ and $W_L$ and the overlapped wafer $W_T$ and a temperature adjusting part 120 configured to adjust a temperature of the lower wafer $W_L$, are installed one above another. The transitions 110 are installed in, e.g., two stages, to simultaneously mount two of the upper and lower wafers $W_U$ and $W_L$ and the overlapped wafer $W_T$.

The temperature adjusting part 120 includes a temperature adjusting plate 121 configured to adjust the temperature of the lower wafer $W_L$. For example, a Peltier element is incorporated in the temperature adjusting plate 12. The temperature of the temperature adjusting plate 121 is controlled by, e.g., the control part 70, whereby the temperature of the lower wafer $W_L$ mounted on the temperature adjusting plate 121 is adjusted to a predetermined temperature. The number and arrangement of the temperature adjusting part 120 is not limited to this embodiment and may be arbitrarily set.

A wafer transfer mechanism 130 is installed in the transfer region T1. The wafer transfer mechanism 130 includes a transfer arm which is movable in, e.g., the vertical direction and the horizontal directions (in the Y-axis direction and the X-axis direction) and is rotatable about the vertical axis. The wafer transfer mechanism 130 is capable of transferring the upper and lower wafers $W_U$ and $W_L$ and the overlapped wafer $W_T$ within the transfer region T1 or between the transfer region T1 and the processing region T2.

At the backward side of the X-axis direction in the transfer region T1, a position adjusting mechanism 140 configured to adjust an orientation of the horizontal direction of the upper or lower wafer $W_U$ or $W_L$ is installed. The position adjusting mechanism 140 includes a base 141 having a holding part (not shown) configured to hold and rotate the upper or lower wafer $W_U$ or $W_L$, and a detecting part 142 configured to detect a position of a notch portion formed in the upper or lower wafer $W_U$ or $W_L$. In the position adjusting mechanism 140, the detecting part 142 detects the position of the notch portion formed in the upper or lower wafer $W_U$ or $W_L$ while rotating the upper or lower wafer $W_U$ or $W_L$ held in the base 141. Thus, the position adjusting mechanism 140 adjusts the position of the notch portion and adjusts the orientation of the horizontal direction of the upper or lower wafer $W_U$ or $W_L$. The method of holding the upper or lower wafer $W_U$ or $W_L$ using the base 141 is not particularly limited. Various methods such as a pin chuck method, a spin chuck method or the like may be used.

In the transfer region T1, there is also installed an inverting mechanism 150 configured to invert the front and rear surfaces of the upper wafer $W_U$. The inverting mechanism 150 includes a holding arm 151 configured to hold the upper wafer $W_U$. The holding arm 151 extends in the horizontal direction (in the Y-axis direction). In the holding arm 151, holding members 152 configured to hold the upper wafer $W_U$ are installed at, e.g., four points.

The holding arm 151 is supported by a drive part 153 provided with, e.g., a motor and the like. The holding arm 151 is rotatable about a horizontal axis with an operation of the drive part 153. The holding arm 151 is not only rotatable about the drive part 153 but also movable in the horizontal direction (in the Y-axis direction). Another drive part (not shown) provided with, e.g., a motor and the like, is installed below the drive part 153. By virtue of another drive part, the drive part 153 is movable in the vertical direction along a support post 154 extending in the vertical direction. Thus, the upper wafer $W_U$ held in the holding members 152 is rotatable about the horizontal axis and is movable in the vertical direction and the horizontal direction by the operation of the drive part 153. Furthermore, the upper wafer $W_U$ held in the holding members 152 is swingable about the drive part 153 and is movable between the position adjusting mechanism 140 and an upper chuck 160 which will be described later.

In the processing region T2, there are installed the upper chuck 160 used as a first holding part that sucks and holds the upper wafer $W_U$ on the lower surface thereof and a lower chuck 161 used as a second holding part that sucks and holds the lower wafer $W_L$ on the upper surface thereof. The lower chuck 161 is installed below the upper chuck 160 and is disposed so as to face the upper chuck 160. That is to say, the upper wafer $W_U$ held in the upper chuck 160 and the lower wafer $W_L$ held in the lower chuck 161 are disposed so as to face each other.

The upper chuck 160 is supported by an upper chuck support part 170 installed above the upper chuck 160. The upper chuck support part 170 is installed on a ceiling surface of the processing vessel 100. That is to say, the upper chuck 160 is fixed to and installed in the processing vessel 100 via the upper chuck support part 170.

In the upper chuck support part 170, there is installed an upper imaging part 171 configured to image the front surface $W_{L1}$ of the lower wafer $W_L$ held in the lower chuck 161. That is to say, the upper imaging part 171 is installed adjacent to the upper chuck 160. For example, a CCD camera is used as the upper imaging part 171.

The lower chuck 161 is supported by a first lower chuck moving part 180 installed below the lower chuck 161. As will be described later, the first lower chuck moving part 180 is configured to move the lower chuck 161 in the horizontal direction (the Y-axis direction). Moreover, the first lower chuck moving part 180 is configured to move the lower chuck 161 in the vertical direction and to rotate the lower chuck 161 about the vertical axis.

In the first lower chuck moving part 180, there is installed a lower imaging part 181 configured to image the front surface $W_{U1}$ of the upper wafer $W_U$ held in the upper chuck 160. That is to say, the lower imaging part 181 is installed adjacent to the lower chuck 161. For example, a CCD camera is used as the lower imaging part 181.

The first lower chuck moving part 180 is installed on a pair of rails 182 and 182 provided at a lower surface side of the first lower chuck moving part 180 and extending in the horizontal direction (the Y-axis direction). The first lower chuck moving part 180 is configured to move along the rails 182.

The rails 182 and 182 are disposed on a second lower chuck moving part 183. The second lower chuck moving part 183 is installed on a pair of rails 184 and 184 provided at a lower surface side of the second lower chuck moving part 183 and extending in the horizontal direction (the X-axis direction). The second lower chuck moving part 183 is configured to move along the rails 184. That is to say, the second lower chuck moving part 183 is configured to move the lower chuck 161 in the horizontal direction (the X-axis direction). The rails 184 and 184 are disposed on a mounting stand 185 installed on a bottom surface of the processing vessel 100.

Next, a description will be made on a detailed configuration of the upper chuck 160 and the lower chuck 161 of the bonding apparatus 41.

Figure 7:
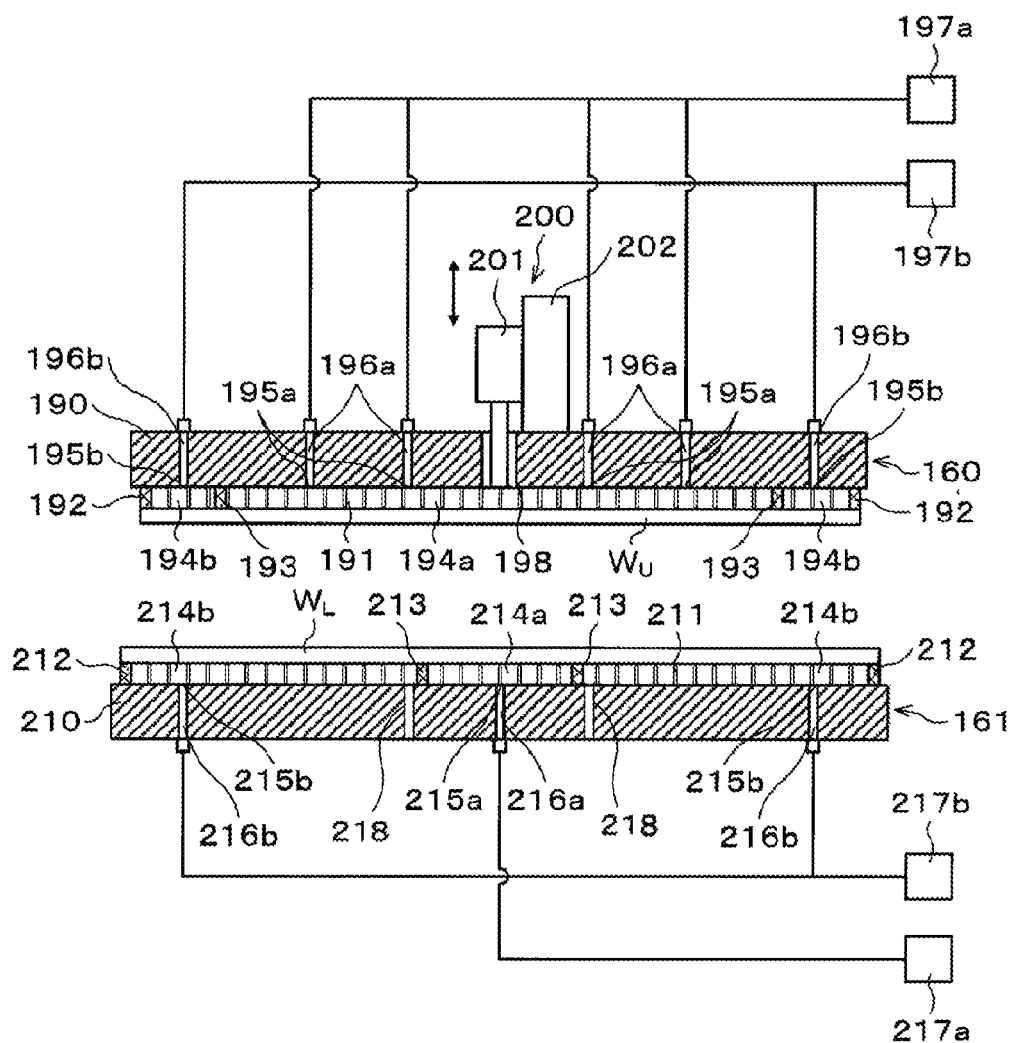
FIG. 7 is a vertical sectional view schematically showing configurations of an upper chuck and a lower chuck.
Figure 8:
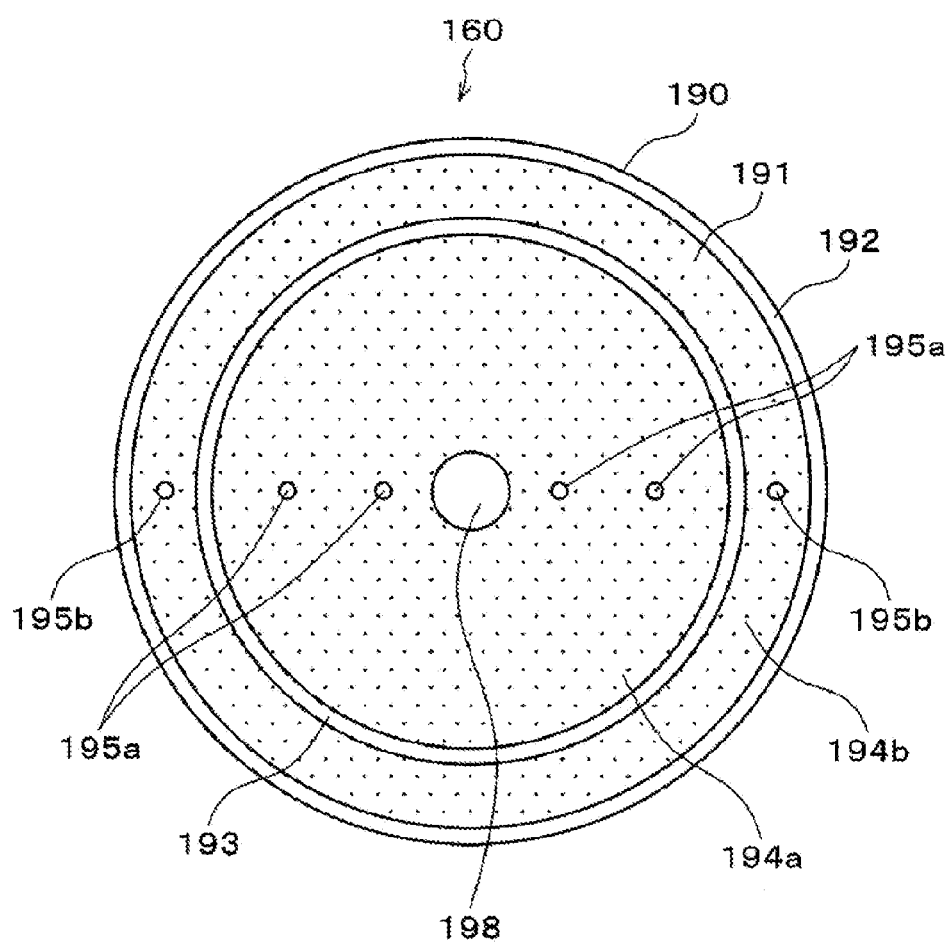
FIG. 8 is a bottom plan view of the upper chuck.

As shown in FIGS. 7 and 8, the upper chuck 160 employs a pin chuck system. The upper chuck 160 includes a body part 190 having a diameter at least larger than the diameter of the upper wafer $W_U$ when seen from the top. A plurality of pins 191 which makes contact with the rear surface $W_{U2}$ of the upper wafer $W_U$ is installed on the lower surface of the body part 190. Furthermore, a rib 192 which supports the outer peripheral portion of the rear surface $W_{U2}$ of the upper wafer $W_U$ is installed on the lower surface of the body part 190. The rib 192 is annularly installed outward of the pins 191.

Furthermore, an additional rib 193 is installed on the lower surface of the body part 190 inward of the rib 192. The rib 193 is annularly installed in a concentric relationship with the rib 192. A region 194 inward of the rib 192 (hereinafter sometimes referred to as a "suction region 194") is divided into a first suction region 194a defined inward of the rib 193 and a second suction region 194b defined outward of the rib 193.

On the lower surface of the body part 190, first suction holes 195a for vacuum-drawing the upper wafer $W_U$ are formed in the first suction region 194a. The first suction holes 195a are formed at, e.g., four points in the first suction region 194a. The first suction holes 195a are connected to first suction pipes 196a installed within the body part 190, respectively. The first suction pipes 196a are coupled to a first vacuum pump 197a through joints.

On the lower surface of the body part 190, second suction holes 195b for vacuum-drawing the upper wafer $W_U$ are formed in the second suction region 194b. The second suction holes 195b are formed at, e.g., two points in the second suction region 194b. The second suction holes 195b are connected to respective second suction pipes 196b installed within the body part 190. The second suction pipes 196b are coupled to a second vacuum pump 197b through joints.

The suction regions 194a and 194b surrounded by the upper wafer $W_U$, the body part 190 and the rib 192 are respectively vacuum-drawn from the suction holes 195a and 195b, whereby the suction regions 194a and 194b are depressurized. At this time, an external environment of the suction regions 194a and 194b is kept at an atmospheric pressure. Thus, the upper wafer $W_U$ is pressed by the atmospheric pressure toward the suction regions 194a and 194b just as much as the depressurized amount so that the upper wafer $W_U$ is sucked and held by the upper chuck 160. Moreover, the upper chuck 160 is configured to vacuum-draw the upper wafer $W_U$ in each of the first suction region 194a and the second suction region 194b.

Since the rib 192 supports the outer peripheral portion of the rear surface $W_{U2}$ of the upper wafer $W_U$, the upper wafer $W_U$ is appropriately vacuum-drawn up to the outer peripheral portion thereof. Thus, the entire surface of the upper wafer $W_U$ is sucked and held by the upper chuck 160. This reduces the flatness of the upper wafer $W_U$, thus making the upper wafer $W_U$ flat.

Inasmuch as the height of the pins 191 is uniform, it is possible to further reduce the flatness of the lower surface of the upper chuck 160. By making the lower surface of the upper chuck 160 flat (by reducing the flatness of the lower surface of the upper chuck 160) in this way, it is possible to suppress vertical distortion of the upper wafer $W_U$ held in the upper chuck 160.

Since the rear surface $W_{U2}$ of the upper wafer $W_U$ is supported by the pins 191, the upper wafer $W_U$ is easily separated from the upper chuck 160 when the upper chuck 160 releases the vacuum-drawing of the upper wafer $W_U$.

In the upper chuck 160, a through-hole 198 extending through the body part 190 in a thickness direction is formed in the central portion of the body part 190. The central portion of the body part 190 corresponds to the central portion of the upper wafer $W_U$ sucked and held by the upper chuck 160. A tip portion of an actuator part 201 of a pressing part 200 (which will be described later) is inserted into the through-hole 198.

The pressing part 200 configured to press the central portion of the upper wafer $W_U$ is installed on the upper surface of the upper chuck 160. The pressing part 200 includes the actuator part 201 used as a pressing member and a cylinder part 202.

The actuator part 201 is configured to generate a constant pressure in a specified direction using air supplied from an electro-pneumatic regulator (not shown). The actuator part 201 can constantly generate pressure regardless of a position of a pressure action point. By virtue of the air supplied from the electro-pneumatic regulator, the actuator part 201 is brought into contact with the central portion of the upper wafer $W_U$ to control a pressing load applied to the central portion of the upper wafer $W_U$. Furthermore, the tip portion of the actuator part 201 is configured to vertically move up and down through the through-hole 198 by virtue of the air supplied from the electro-pneumatic regulator.

The actuator part 201 is supported by the cylinder part 202. The cylinder part 202 is configured to vertically move the actuator part 201 using, e.g., a drive part provided with a motor.

As mentioned above, the pressing part 200 controls the pressing load using the actuator part 201 and controls the movement of the actuator part 201 using the cylinder part 202. When bonding the upper wafer $W_U$ and the lower wafer the $W_L$, the pressing part 200 can bring the central portion of the upper wafer $W_U$ into contact with the central portion of the lower wafer $W_L$ and can press the central portion of the upper wafer $W_U$ against the central portion of the lower wafer $W_L$.

Figure 9:
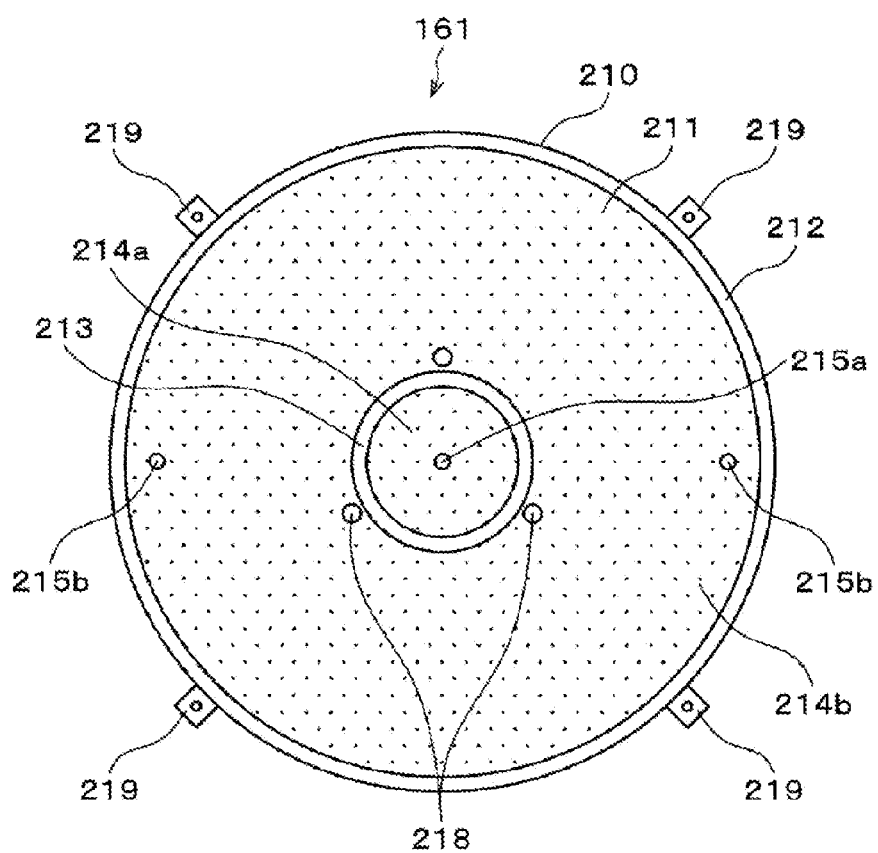
FIG. 9 is a top plan view of the lower chuck.

As shown in FIGS. 7 and 9, similar to the upper chuck 160, the lower chuck 161 employs a pin chuck system. The lower chuck 161 includes a body part 210 having a diameter at least larger than a diameter of the lower wafer $W_L$ when seen from the top. A plurality of pins 211 which makes contact with the rear surface $W_{L2}$ of the lower wafer $W_L$ is installed on an upper surface of the body part 210. Furthermore, a rib 212 which supports an outer peripheral portion of the rear surface $W_{L2}$ of the lower wafer $W_L$ is installed on the upper surface of the body part 210. The rib 212 is annularly installed outward of the pins 211.

Furthermore, an additional rib 213 is installed on the upper surface of the body part 210 inward of the rib 212. The rib 213 is annularly installed in a concentric relationship with the rib 212. A region 214 inward of the rib 212 (hereinafter sometimes referred to as a "suction region 214") is divided into a first suction region 214a defined inward of the rib 213 and a second suction region 214b defined outward of the rib 213.

On the upper surface of the body part 210, there is formed a first suction hole 215a for vacuum-drawing the lower wafer $W_L$ in the first suction region 214a. The first suction hole 215a is formed at, e.g., one point in the first suction region 214a. The first suction hole 215a is connected to a first suction pipe 216a installed within the body part 210. The first suction pipe 216a is coupled to a first vacuum pump 217a through a joint.

Further, on the upper surface of the body part 210, second suction holes 215b for vacuum-drawing the lower wafer $W_L$ are formed in the second suction region 214b. The second suction holes 215b are formed at, e.g., two points in the second suction region 214b. The second suction holes 215b is connected to second suction pipes 216b installed within the body part 210, respectively. The second suction pipes 216b is coupled to a second vacuum pump 217b through joints.

The first and second suction regions 214a and 214b surrounded by the lower wafer $W_L$, the body part 210 and the rib 212 are respectively vacuum-drawn from the suction holes 215a and 215b so that they are depressurized. At this time, an external environment of the suction regions 214a and 214b is kept at atmospheric pressure. Thus, the lower wafer $W_L$ is pressed by the atmospheric pressure toward the first and second suction regions 214a and 214b just as much as the depressurized amount. Consequently, the lower wafer $W_L$ is sucked and held by the lower chuck 161. Moreover, the lower chuck 161 is configured to vacuum-draw the lower wafer $W_L$ in each of the first suction region 214a and the second suction region 214b.

Since the rib 212 supports the outer peripheral portion of the rear surface $W_{L2}$ of the lower wafer $W_L$, the lower wafer $W_L$ is appropriately vacuum-drawn up to the outer peripheral portion thereof. Thus, the entire surface of the lower wafer $W_L$ is sucked and held by the lower chuck 161. This reduces the flatness of the lower wafer $W_L$, thus making the lower wafer $W_L$ flat.

Inasmuch as the height of the pins 211 is uniform, it is possible to further reduce the flatness of the upper surface of the lower chuck 161. For example, even when particles exist within the processing vessel 100, it is possible to suppress existence of particles on the upper surface of the lower chuck 161 because the interval of the pins 211 adjoining each other is appropriate. By making the upper surface of the lower chuck 161 flat (by reducing the flatness of the upper surface of the lower chuck 161) in this way, it is possible to suppress vertical distortion of the lower wafer $W_L$ held in the lower chuck 161.

Since the rear surface $W_{L2}$ of the lower wafer $W_L$ is supported by the pins 211, the lower wafer $W_L$ is easily separated from the lower chuck 161 when the lower chuck 161 releases the vacuum-drawing of the lower wafer $W_L$.

In the lower chuck 161, through-holes 218 extending through the body part 210 in a thickness direction are formed at, e.g., three points, near the central portion of the body part 210. Lift pins (not shown) installed below the first lower chuck moving part 180 are inserted into the through-holes 218, respectively.

In the outer peripheral portion of the body part 210, there are installed guide members 219 which prevent the wafers $W_U$ and $W_L$ and the overlapped wafer $W_T$ from jumping out or sliding down from the lower chuck 161. The guide members 219 are installed at a plurality of, e.g., four, points at regular intervals in the outer peripheral portion of the body part 210.

Operations of the respective parts of the bonding apparatus 41 are controlled by the aforementioned control part 70.

Figure 10:
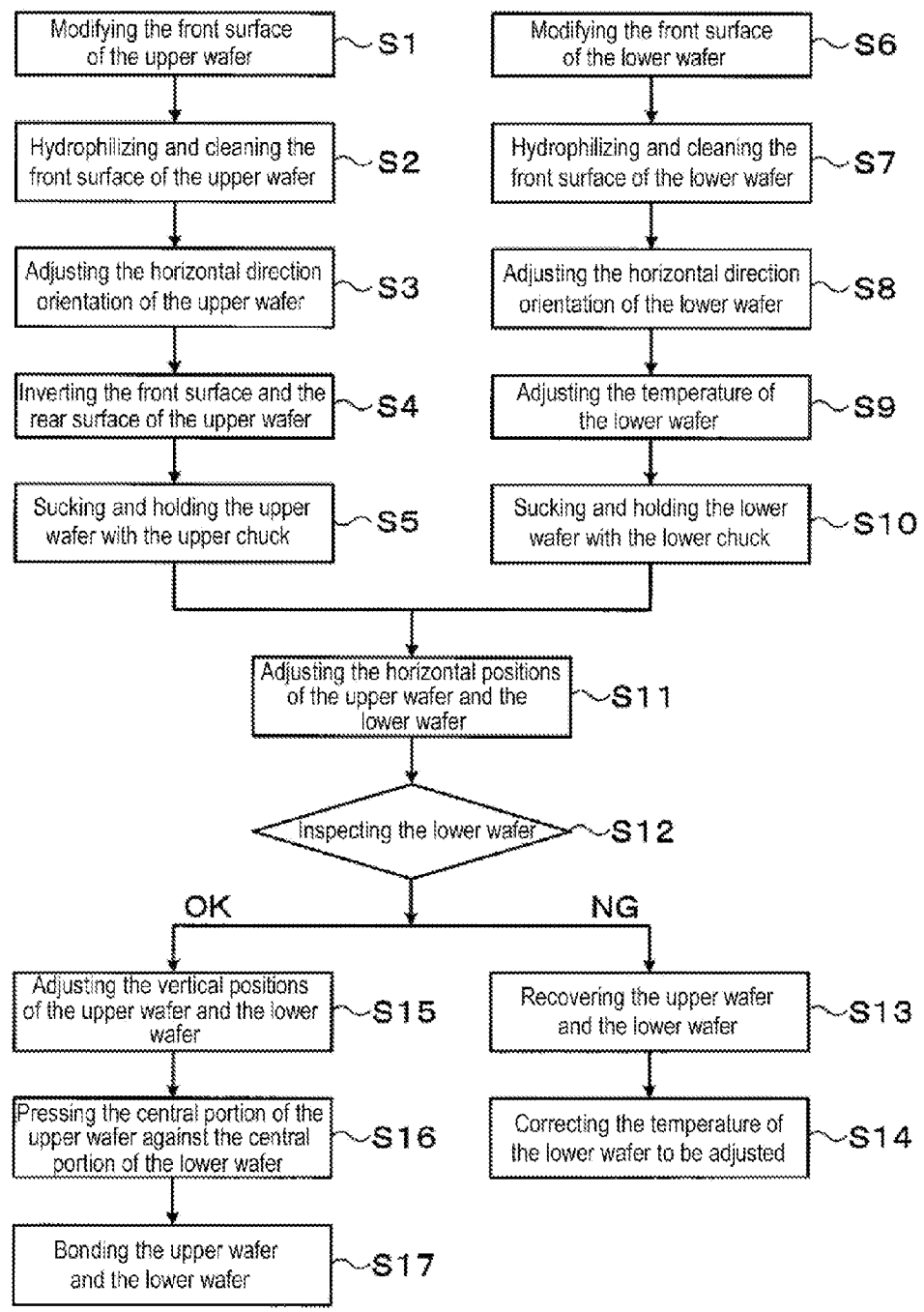
FIG. 10 is a flowchart showing main operations of a wafer bonding process.

Next, a description will be made on a process of bonding the upper and lower wafers $W_U$ and $W_L$ performed by the bonding system 1 configured as above. FIG. 10 is a flowchart showing examples of main operations of the wafer bonding process.

First, the cassette $C_U$ accommodating a plurality of upper wafers $W_U$, the cassette $C_L$ accommodating a plurality of lower wafers $W_L$ and the empty cassette $C_T$ are mounted on the respective cassette mounting boards 11 of the carry-in/carry-out station 2. Thereafter, the upper wafer $W_U$ is taken out from the cassette $C_U$ by the wafer transfer device 22 and is transferred to the transition device 50 of the third processing block G3 of the processing station 3.

Subsequently, the upper wafer $W_U$ is transferred to the surface modifying apparatus 30 of the first processing block G1 by the wafer transfer device 61. In the surface modifying apparatus 30, an oxygen gas or a nitrogen gas used as a process gas is excited, converted to plasma and ionized under a specified depressurized environment. Oxygen ions or nitrogen ions thus generated are irradiated onto the front surface $W_{U1}$ of the upper wafer $W_U$, whereby the front surface $W_{U1}$ is plasma-processed. Thus, the front surface $W_{U1}$ of the upper wafer $W_U$ is modified (Step S1 in FIG. 10).

Thereafter, the upper wafer $W_U$ is transferred to the surface hydrophilizing apparatus 40 of the second processing block G2 by the wafer transfer device 61. In the surface hydrophilizing apparatus 40, pure water is supplied onto the upper wafer $W_U$ while rotating the upper wafer $W_U$ held in a spin chuck. The supplied pure water is diffused on the front surface $W_{U1}$ of the upper wafer $W_U$ so that hydroxyl groups (silanol groups) adhere to the front surface $W_{U1}$ of the upper wafer $W_U$ modified in the surface modifying apparatus 30. Thus, the front surface $W_{U1}$ is hydrophilized. Furthermore, the front surface $W_{U1}$ of the upper wafer $W_U$ is cleaned by the pure water (Step S2 in FIG. 10).

Subsequently, the upper wafer $W_U$ is transferred to the bonding apparatus 41 of the second processing block G2 by the wafer transfer device 61. The upper wafer $W_U$ carried into the bonding apparatus 41 is transferred to the position adjusting mechanism 140 through the transition 110 by the wafer transfer mechanism 130. The orientation of the horizontal direction of the upper wafer $W_U$ is adjusted by the position adjusting mechanism 140 (Step S3 in FIG. 10).

Thereafter, the upper wafer $W_U$ is delivered from the position adjusting mechanism 140 to the holding arm 151 of the inverting mechanism 150. Subsequently, in the transfer region T1, the holding arm 151 is inverted to thereby invert the front and rear surfaces of the upper wafer $W_U$ (Step S4 in FIG. 10). That is to say, the front surface $W_{U1}$ of the upper wafer $W_U$ is oriented downward.

Thereafter, the holding arm 151 of the inverting mechanism 150 rotates about the drive part 153 and moves below the upper chuck 160. Then, the upper wafer $W_U$ is delivered from the inverting mechanism 150 to the upper chuck 160.

The rear surface $W_{U2}$ of the upper wafer $W_U$ is sucked and held by the upper chuck 160 (Step S5 in FIG. 10). Specifically, the vacuum pumps 197a and 197b are operated to vacuum-draw the upper wafer $W_U$ through the suction holes 195a and 195b in the first and second suction regions 194a and 194b. Thus, the upper wafer $W_U$ is sucked and held by the upper chuck 160.

The upper wafer $W_U$ held by the upper chuck 160 in this way is kept at a temperature substantially equal to the environmental temperature of the processing region T2. As such, the upper wafer $W_U$ is not expanded or contracted due to a change in temperature so that the shape and dimension of the upper wafer $W_U$ remain unchanged.

While a sequence of steps S1 to S5 as described above is being performed with respect to the upper wafer $W_U$, the lower wafer $W_L$ following the upper wafer $W_U$ is processed. First, the lower wafer $W_L$ is taken out from the cassette $C_L$ by the wafer transfer device 22 and is transferred to the transition device 50 of the processing station 3.

Subsequently, the lower wafer $W_L$ is transferred to the surface modifying apparatus 30 by the wafer transfer device 61. The front surface $W_{L1}$ of the lower wafer $W_L$ is modified in the surface modifying apparatus 30 (Step S6 in FIG. 10). The modification of the front surface $W_{L1}$ of the lower wafer $W_L$ performed at Step S6 is the same as that performed at Step S1 described above.

Thereafter, the lower wafer $W_L$ is transferred to the surface hydrophilizing apparatus 40 by the wafer transfer device 61. The front surface $W_{L1}$ of the lower wafer $W_L$ is hydrophilized and cleaned in the surface hydrophilizing apparatus 40 (Step S7 in FIG. 10). The hydrophilizing and cleaning of the front surface $W_{L1}$ of the lower wafer $W_L$ performed at Step S7 is the same as those performed at Step S2 described above.

Subsequently, the lower wafer $W_L$ is transferred to the bonding apparatus 41 by the wafer transfer device 61. The lower wafer $W_L$ carried into the bonding apparatus 41 is transferred to the position adjusting mechanism 140 through the transition 110 by the wafer transfer mechanism 130. The orientation of the horizontal direction of the lower wafer $W_L$ is adjusted by the position adjusting mechanism 140 (Step S8 in FIG. 10).

Thereafter, the lower wafer $W_L$ is transferred to the temperature adjusting part 120 by the wafer transfer mechanism 130. In the temperature adjusting part 120, the lower wafer $W_L$ is mounted on the temperature adjusting plate 121 where a temperature of the lower wafer $W_L$ is adjusted to a predetermined temperature higher than the temperature of the upper wafer $W_U$ (Step S9 in FIG. 10).

Subsequently, the lower wafer $W_L$ is transferred to the lower chuck 161 by the wafer transfer mechanism 130. The rear surface $W_{L2}$ of the lower wafer $W_L$ is sucked and held by the lower chuck 161 (Step S10 in FIG. 10). Specifically, the vacuum pumps 217a and 217b are operated to vacuum-draw the lower wafer $W_L$ through the suction holes 215a and 215b in the first and second suction regions 214a and 214b, whereby the lower wafer $W_L$ is sucked and held by the lower chuck 161.

The temperature of the lower wafer $W_L$ held by the lower chuck 161 in this way has already been adjusted to the temperature higher than the temperature of the upper wafer $W_U$ at Step S9 described above. As such, the lower wafer $W_L$ is expanded to become several micrometers larger than the upper wafer $W_U$. By adjusting the expansion amount of the lower wafer $W_L$, it is possible to equalize the diameter of the upper wafer $W_U$ and the diameter of the lower wafer $W_L$ even when the central portion of the upper wafer $W_U$ is pressed by the actuator part 201 at Step S16 (which will be described later) and the upper wafer $W_U$ is warped and stretched in a downwardly convex shape.

Subsequently, the horizontal positions of the upper wafer $W_U$ held by the upper chuck 160 and the lower wafer $W_L$ held by the lower chuck 161 are adjusted.

Figure 11:
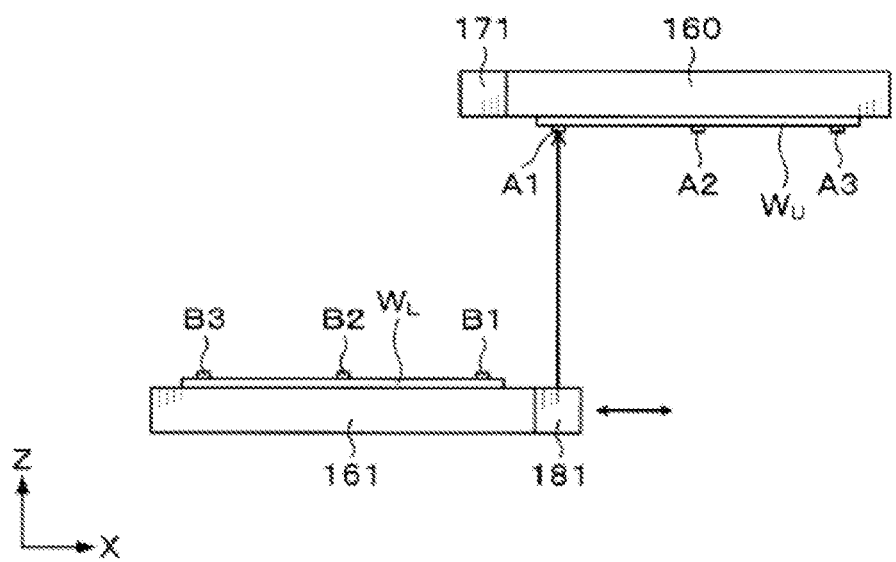
FIG. 11 is an explanatory view showing a state in which a position adjusting point of an upper wafer is imaged by a lower imaging part.

As shown in FIG. 11, a plurality of (e.g., three) predetermined position adjusting points A1, A2 and A3 is set on the front surface $W_{U1}$ of the upper wafer $W_U$. Similarly, a plurality of (e.g., three) predetermined position adjusting points B1, B2 and B3 is set on the front surface $W_{L1}$ of the lower wafer $W_L$. The position adjusting points A1 and A3 and the position adjusting points B1 and B3 are points that exist in the outer peripheral portions of the upper wafer $W_U$ and the lower wafer $W_L$, respectively. The position adjusting points A2 and B2 are points that exist in the central portions of the upper wafer $W_U$ and the lower wafer $W_L$, respectively. While the position adjusting points on each of the upper wafer $W_U$ and the lower wafer $W_L$ is three in this embodiment, the number of the position adjusting points is not limited thereto but may be arbitrarily set.

First, as shown in FIG. 11, the lower chuck 161 is moved in the horizontal directions (in the X-axis direction and the Y-axis direction) by the first lower chuck moving part 180 and the second lower chuck moving part 183. The position adjusting points A1, A2 and A3 of the upper wafer $W_U$ are sequentially imaged by the lower imaging part 181. Then, the positions of the position adjusting points A1, A2 and A3 are measured by the control part 70.

Figure 12:
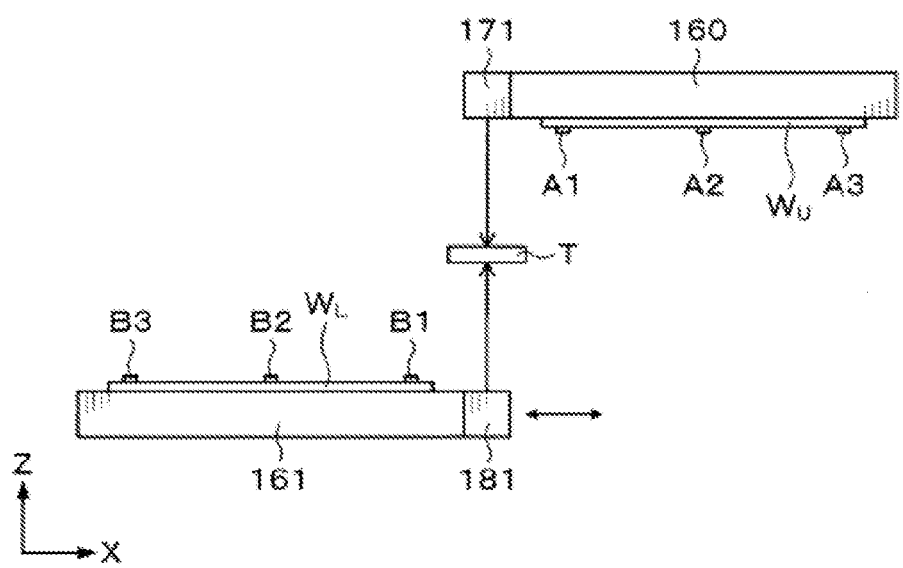
FIG. 12 is an explanatory view showing a state in which horizontal positions of an upper imaging part and a lower imaging part are adjusted.

Subsequently, as shown in FIG. 12, while the lower chuck 161 is moved in the horizontal direction by the first lower chuck moving part 180 and the second lower chuck moving part 183, a common target T is identified by the upper imaging part 171 and the lower imaging part 181. Then, the control part 70 adjusts a horizontal position of the lower imaging part 181 such that the horizontal positions of the upper imaging part 171 and the lower imaging part 181 are matched with each other.

Figure 13:
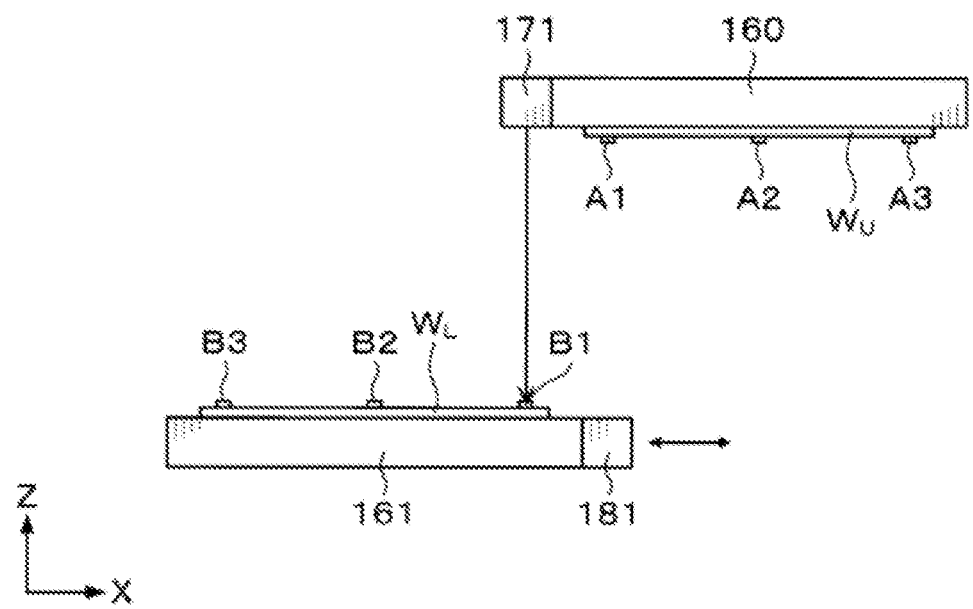
FIG. 13 is an explanatory view showing a state in which a position adjusting point of a lower wafer is imaged by an upper imaging part.

Thereafter, as shown in FIG. 13, the lower chuck 161 is moved in the horizontal direction by the first lower chuck moving part 180 and the second lower chuck moving part 183. The position adjusting points B1, B2 and B3 of the lower wafer $W_L$ are sequentially imaged by the upper imaging part 171. Then, the positions of the position adjusting points B1, B2 and B3 are measured by the control part 70. The control part 70 controls the first lower chuck moving part 180 and the second lower chuck moving part 183 to adjust the horizontal positions of the lower chuck 161 such that the position adjusting points A1, A2 and A3 of the upper wafer $W_U$ and the position adjusting points B1, B2 and B3 of the lower wafer $W_L$ are respectively matched with each other. In this way, the horizontal positions of the upper chuck 160 and the lower chuck 161 are adjusted, whereby the horizontal positions of the upper wafer $W_U$ and the lower wafer $W_L$ are adjusted (Step S11 in FIG. 10).

When performing the adjustment of the horizontal positions, the lower chuck 161 is moved in the horizontal directions (in the X-axis direction and the Y-axis direction) as described above and the lower chuck 161 is rotated by the first lower chuck moving part 180, thereby adjusting an orientation of the lower chuck 161.

Thereafter, a state of the lower wafer $W_L$ held by the lower chuck 161 is inspected. Specifically, inspection is performed as to whether the expansion amount of the lower wafer $W_L$, the temperature of which has been adjusted at Step S9, is proper. The inspection of the state (the inspection of the expansion amount) of the lower wafer $W_L$ is performed in order to verify the scaling suppression effect described above.

Figure 14:
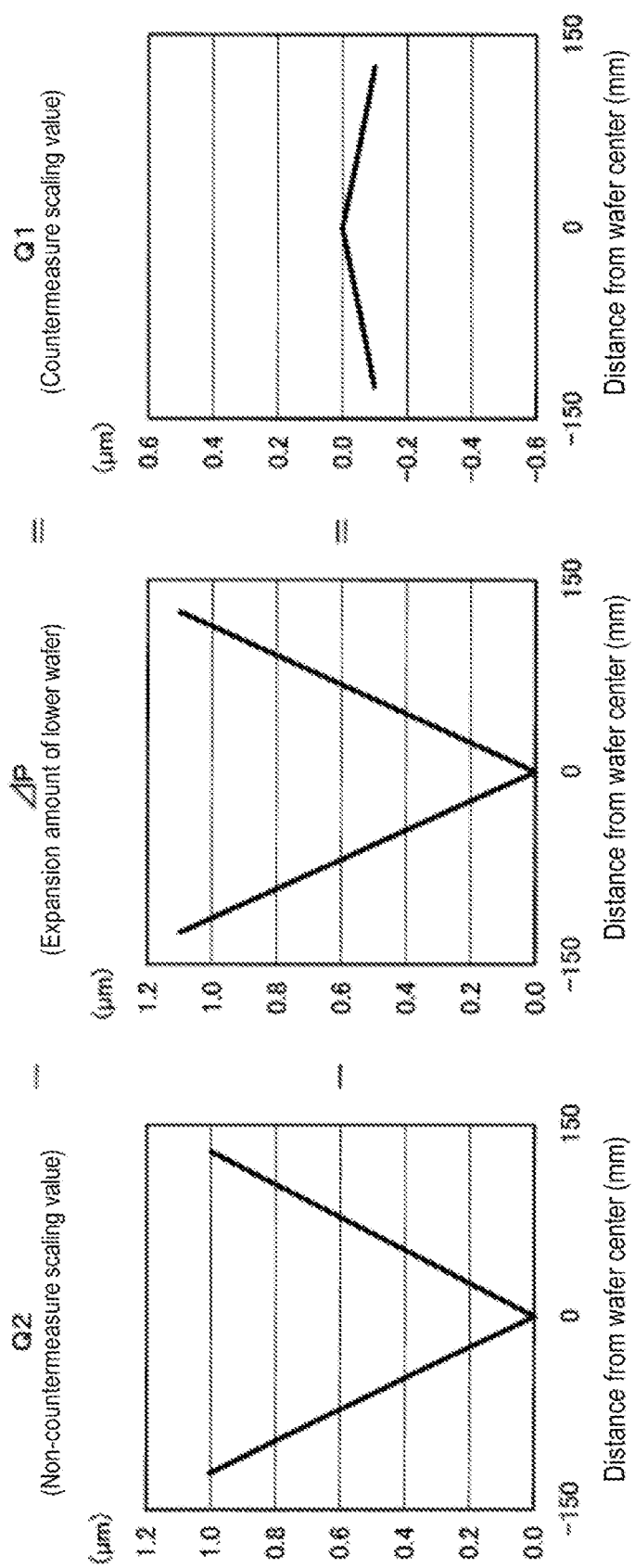
FIG. 14 is graphs showing a relationship between an expansion amount of a lower wafer and a scaling value.

Now, a relationship between the expansion amount of the lower wafer WL and the scaling value will be described with reference to FIG. 14. The left side graph in FIG. 14 shows a horizontal position deviation (namely, a scaling value) of the upper wafer $W_U$ and the lower wafer $W_L$ in the overlapped wafer $W_T$, which is obtained by bonding the upper wafer $W_U$ and the lower wafer $W_L$, in the absence of the temperature adjustment of the lower wafer $W_L$ performed at Step S9 according to this embodiment (namely, in the absence of the scaling countermeasure). The central graph in FIG. 14 shows the expansion amount of the lower wafer $W_L$ whose temperature is adjusted at Step S9. The right side graph in FIG. 14 shows a computational scaling value of the overlapped wafer $W_T$ in the presence of the scaling countermeasure according to this embodiment. In FIG. 14, a horizontal axis of each of the graphs indicates a distance from the center of the lower wafer $W_L$. In FIG. 14, the scaling value and the expansion amount of the lower wafer $W_L$ are values for reference and are not actual values.

As shown in FIG. 14, a scaling value Q1 available in the application of the scaling countermeasure (hereinafter referred to as a "countermeasure scaling value Q1") is calculated by the following formula (1) using a scaling value Q2 available in the absence of the scaling countermeasure (hereinafter referred to as a "non-countermeasure scaling value Q2") and an expansion amount ΔP of the lower wafer $W_L$ (hereinafter referred to as an "expansion amount ΔP"). The non-countermeasure scaling value Q2 is previously found by measuring a scaling value of the overlapped wafer $W_T$ which is obtained by actually bonding the upper wafer $W_U$ and the lower wafer $W_L$.

$$Q1=Q2-\Delta P \quad (1)$$

Furthermore, the expansion amount ΔP is calculated by measuring the positions of the reference points previously set on the front surface $W_{L1}$ of the lower wafer $W_L$. That is to say, the expansion amount ΔP of the lower wafer $W_L$ is calculated by the following formula (2) using a reference point position P1 available in the application of the scaling countermeasure (hereinafter referred to as a "countermeasure reference point position P1") and a reference point position P2 available in the absence of the scaling countermeasure (hereinafter referred to as a "non-countermeasure reference point position P2").

$$\Delta P=P1-P2 \quad (2)$$

The non-countermeasure reference point position P2 is a position of the reference point of the lower wafer $W_L$ available in the application of the temperature adjustment process. It is therefore possible to know a theoretical reference point position. However, an error of several micrometers is generated between the theoretical reference point position and an actually-measured reference point position due to a position deviation of a shot itself, an accuracy error of the lower chuck 161, or the like. For that reason, in this embodiment, the non-countermeasure reference point position P2 is measured in advance.

From the formulae (1) and (2), the countermeasure reference point position P1 may be expressed by the following formula (3). As mentioned above, the non-countermeasure scaling value Q2 and the non-countermeasure reference point position P2 are measured in advance. Thus, a permissible range of the countermeasure reference point position P1 may be set from a predetermined permissible range of the countermeasure scaling value Q1.

$$P1=Q2+P2-Q1 \quad (3)$$

Figure 15:
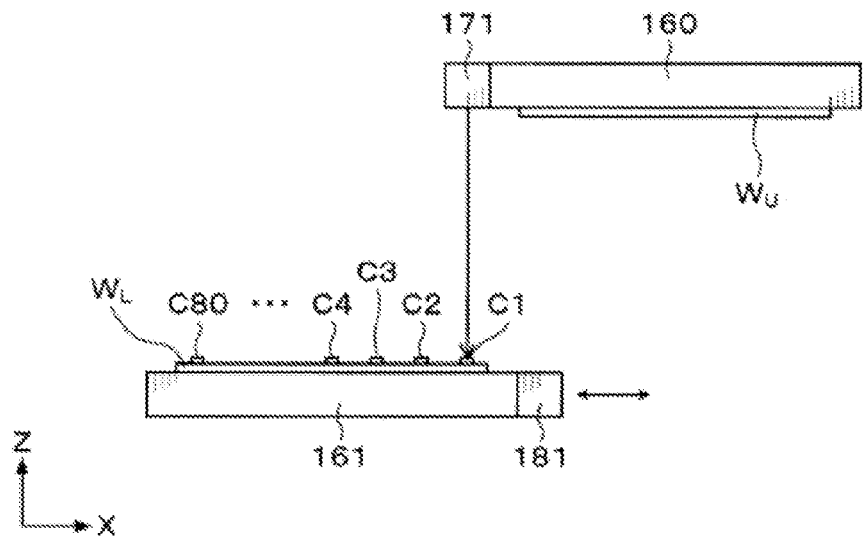
FIG. 15 is an explanatory view showing a state in which a reference point of a lower wafer is imaged by an upper imaging part.

Accordingly, in this embodiment, the position of the reference point of the lower wafer $W_L$ (the countermeasure reference point position P1) is measured in order to verify the scaling suppression effect (the countermeasure scaling value Q1). As shown in FIG. 15, a plurality of (e.g., eighty) predetermined reference points C1 to C80 is set on the front surface $W_{L1}$ of the lower wafer $W_L$. Some of the reference points C1 to C80 may overlap with the aforementioned position adjusting points B1, B2 and B3. In this embodiment, the reference points of the lower wafer $W_L$ has been described to be eighty in this embodiment, but may be arbitrarily set.

As shown in FIG. 15, the lower chuck 161 is moved in the horizontal directions (in the X-axis direction and the Y-axis direction) by the first lower chuck moving part 180 and the second lower chuck moving part 183. The reference points C1 to C80 of the lower wafer $W_L$ are sequentially imaged by the upper imaging part 171. Then, positions of the reference points C1 to C80 are measured by the control part 70.

The control part 70 inspects the state of the lower wafer $W_L$ by comparing the measurement result of the positions of the reference points C1 to C80 with the permissible range of the countermeasure reference point position P1 set as indicated above (Step S12 in FIG. 10).

If it is determined at Step S12 that the measurement result of the positions of the reference points C1 to C80 falls outside a predetermined permissible range and the inspection result of the state of the lower wafer $W_L$ is abnormal, the upper wafer $W_U$ and the lower wafer $W_L$ are moved outside and recovered from the bonding system 1 without going through a subsequent bonding process (Step S13 in FIG. 10).

Further, if the inspection result of the state of the lower wafer $W_L$ is abnormal, the temperature of the lower wafer $W_L$ adjusted in the temperature adjusting part 120 is corrected by the control part 70 (Step S14 in FIG. 10). Specifically, based on the measurement results of the positions of the reference points C1 to C80, the temperature of the lower wafer $W_L$ is corrected so that the positions of the reference points C1 to C80 fall within the predetermined permissible range. Thus, the temperature of the lower wafer $W_L$ to be subsequently processed is adjusted to the temperature corrected at Step S9. This makes it possible to appropriately control the expansion amount of the lower wafer $W_L$.

On the other hand, if it is determined at Step S12 that the measurement results of the positions of the reference points C1 to C80 fall within the predetermined permissible range and the inspection result of the state of the lower wafer $W_L$ is normal, the subsequent bonding process is performed.

Figure 16:
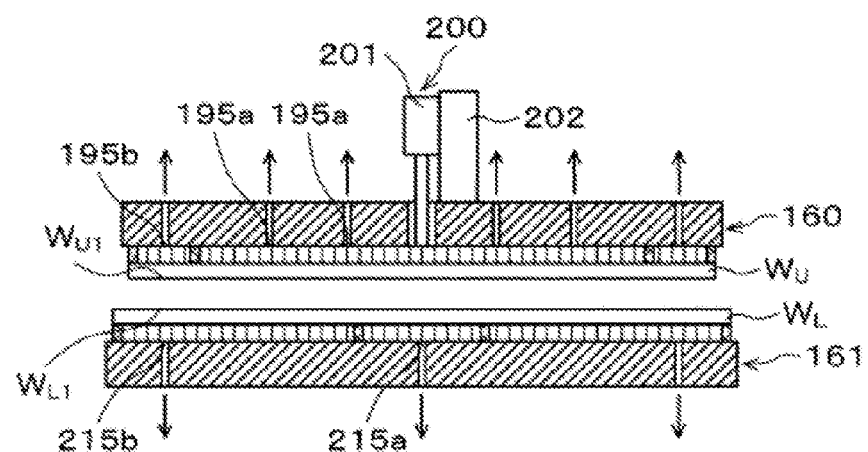
FIG. 16 is an explanatory view showing a state in which an upper wafer and a lower wafer are disposed to face each other.

That is to say, the lower chuck 161 is moved vertically upward by the first lower chuck moving part 180, thereby performing the adjustment of the vertical positions of the upper chuck 160 and the lower chuck 161 and performing the adjustment of the vertical positions of the upper wafer $W_U$ held by the upper chuck 160 and the lower wafer $W_L$ held by the lower chuck 161 (Step S15 in FIG. 10). Subsequently, as shown in FIG. 16, the upper wafer $W_U$ and the lower wafer $W_L$ are disposed in predetermined positions so as to face each other. At this time, the diameter of the lower wafer $W_L$ is larger than the diameter of the upper wafer $W_U$.

Subsequently, the bonding process of the upper wafer $W_U$ held by the upper chuck 160 and the lower wafer $W_L$ held by the lower chuck 161 is performed.

Figure 17:
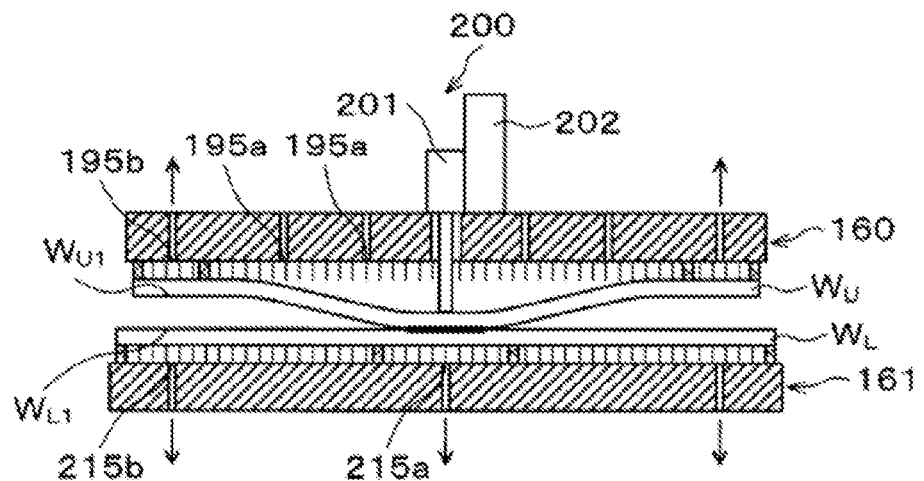
FIG. 17 is an explanatory view showing a state in which a central portion of an upper wafer is pressed into contact with a central portion of a lower wafer.

First, as shown in FIG. 17, the actuator part 201 is moved down by the cylinder part 202 of the pressing part 200. Thus, along with the downward movement of the actuator part 201, the central portion of the upper wafer $W_U$ is pressed and moved down. At this time, a predetermined pressing load is applied to the actuator part 201 by the air supplied from the electro-pneumatic regulator. Then, the pressing part 200 brings the central portion of the upper wafer $W_U$ into contact with the central portion of the lower wafer $W_L$ and presses the central portion of the upper wafer $W_U$ against the central portion of the lower wafer $W_L$ (Step S16 in FIG. 10). At this time, the operation of the first vacuum pump 197a is stopped to stop the vacuum-drawing of the upper wafer $W_U$ from the first suction holes 195a in the first suction region 194a. The second vacuum pump 197b is operated to vacuum-draw the second suction region 194b from the second suction holes 195b. Thus, even when the central portion of the upper wafer $W_U$ is pressed by the pressing part 200, the outer peripheral portion of the upper wafer $W_U$ can be held by the upper chuck 160.

Further, even if the upper wafer $W_U$ is warped and stretched in the downwardly convex shape by the actuator part 201 in this way, it is possible to equalize the diameter of the upper wafer $W_U$ and the diameter of the lower wafer $W_L$ because the lower wafer $W_L$ is temperature-adjusted and expanded at Step S9 and because it is determined at Step S12 that the expansion amount of the lower wafer $W_L$ is proper.

Bonding begins to occur between the central portion of the upper wafer $W_U$ and the central portion of the lower wafer $W_L$ pressed against each other (see a portion indicated by a thick line in FIG. 17). That is to say, the front surface $W_{U1}$ of the upper wafer $W_U$ and the front surface $W_{L1}$ of the lower wafer $W_L$ are previously modified at Steps S1 and S6. Therefore, a Van der Waals force (an intermolecular force) is generated between the front surfaces $W_{U1}$ and $W_{L1}$, whereby the front surfaces $W_{U1}$ and $W_{L1}$ are bonded to each other. Furthermore, the front surface $W_{U1}$ of the upper wafer $W_U$ and the front surface $W_{L1}$ of the lower wafer $W_L$ are previously hydrophilized at Steps S2 and S7. Therefore, the hydrophilic groups existing between the front surfaces $W_{U1}$ and $W_{L1}$ are hydrogen-bonded (by an intermolecular force), whereby the front surfaces $W_{U1}$ and $W_{L1}$ are strongly bonded to each other.

Figure 18:
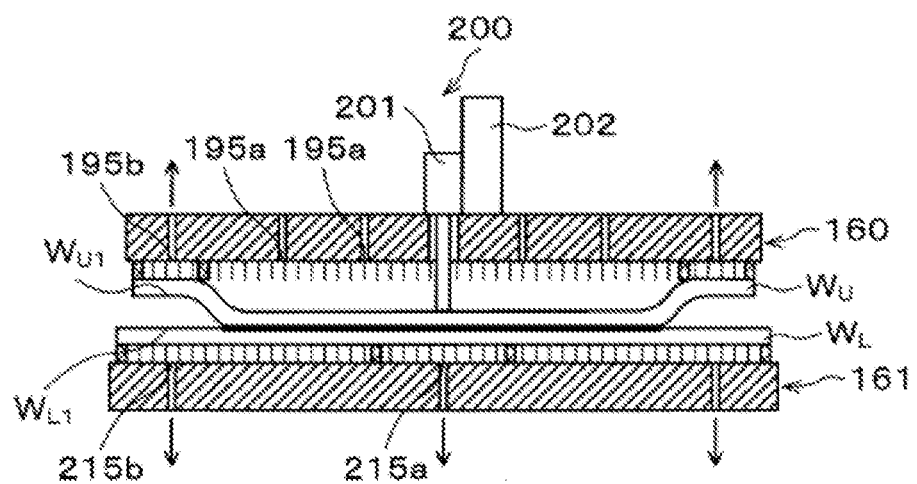
FIG. 18 is an explanatory view showing a state in which an upper wafer and a lower wafer are bonded while spreading from a central portion toward an outer peripheral portion.

Subsequently, as shown in FIG. 18, the bonding between the front surfaces $W_{U1}$ and $W_{L1}$ caused by the Van der Waals force and the hydrogen bonding is spread from the central portion toward the outer peripheral portion. After a predetermined period of time, the bonding of the front surfaces $W_{U1}$ and $W_{L1}$ is completed on substantially the entire surface except the outer peripheral portion. That is to say, the bonding of the front surfaces $W_{U1}$ and $W_{L1}$ is completed in the region other than the second suction region 194b where the upper wafer $W_U$ is vacuum-drawn from the second suction holes 195b.

Figure 19:
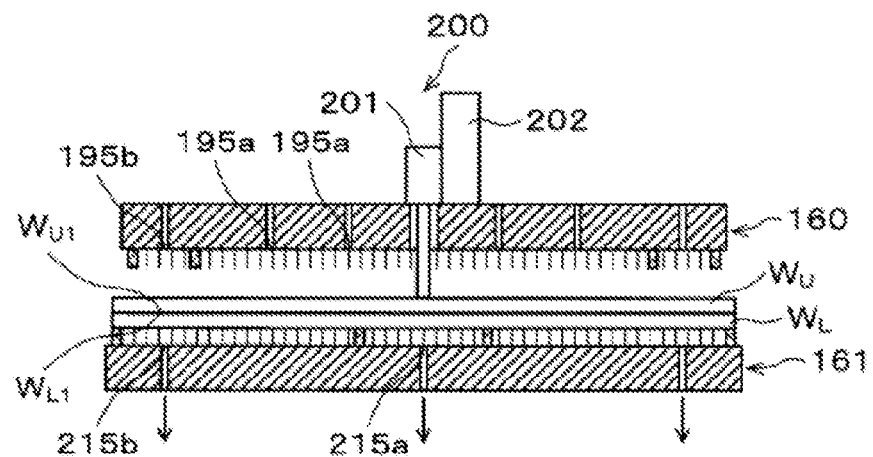
FIG. 19 is an explanatory view showing a state in which surfaces of an upper surface and a lower surface are brought into contact with each other.

Thereafter, as shown in FIG. 19, the operation of the second vacuum pump 197b is stopped in a state in which the central portion of the upper wafer $W_U$ and the central portion of the lower wafer $W_L$ are pressed against each other by the pressing part 200. Thus, the vacuum-drawing of the upper wafer $W_U$ from the second suction pipes 196b in the second suction region 194b is stopped. By doing so, the outer peripheral portion of the upper wafer $W_U$ is dropped onto the lower wafer $W_L$. Consequently, as shown in FIG. 19, the front surface $W_{U1}$ of the upper wafer $W_U$ and the front surface $W_{L1}$ of the lower wafer $W_L$ make contact with each other over the entire surfaces, whereby the upper wafer $W_U$ and the lower wafer $W_L$ are bonded to each other (Step S17 in FIG. 10). At this time, the generation of scaling is suppressed because the diameter of the upper wafer $W_U$ and the diameter of the lower wafer $W_L$ are equal to each other.

Figure 20:
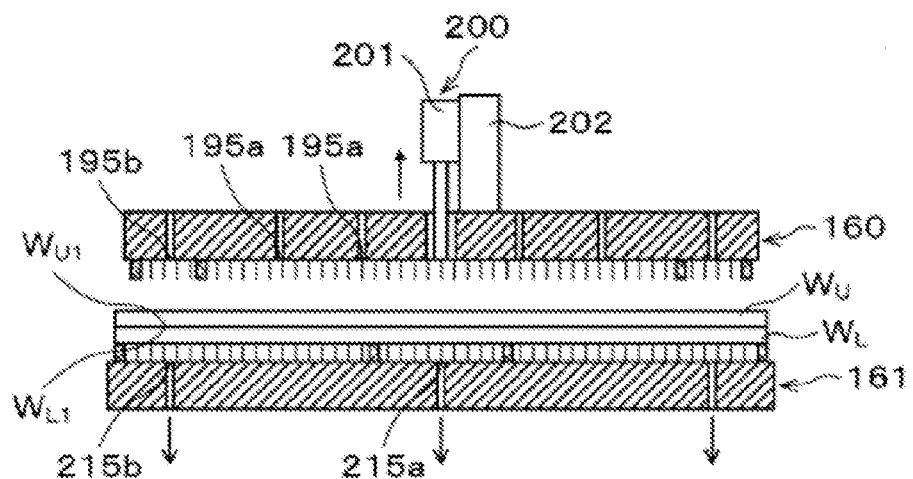
FIG. 20 is an explanatory view showing a state in which an upper wafer and a lower wafer are bonded to each other.

Subsequently, as shown in FIG. 20, the actuator part 201 of the pressing part 200 is moved up to the upper chuck 160. Furthermore, the operations of the vacuum pumps 217a and 217b are stopped and the vacuum-drawing of the lower wafer $W_L$ in the suction region 214 is stopped. Thus, the sucking and holding of the lower wafer $W_L$ by the lower chuck 161 is stopped.

The overlapped wafer $W_T$ obtained by bonding the upper wafer $W_U$ and the lower wafer $W_L$ is transferred to the transition device 51 by the wafer transfer device 61 and is then transferred to the cassette $C_T$ of the respective cassette mounting board 11 by the wafer transfer device 22 of the carry-in/carry-out station 2. In this way, the bonding process of the upper and lower wafers $W_U$ and $W_L$ is finished.

According to the above embodiments, the temperature of the lower wafer $W_L$ is adjusted at Step S9 so that the lower wafer $W_L$ is expanded. If it is determined at Step S12 that the expansion amount of the lower wafer $W_L$ is proper, it is possible to equalize the diameter of the upper wafer $W_U$ and the diameter of the lower wafer $W_L$. By doing so, even if the upper wafer $W_U$ is warped and stretched in the downwardly convex shape by the actuator part 201 at Step S16, it is possible to equalize the diameter of the upper wafer $W_U$ and the diameter of the lower wafer $W_L$ at Step S17. Accordingly, it is possible to suppress the scaling and to appropriately perform the bonding process of the upper wafer $W_U$ and the lower wafer $W_L$.

Moreover, the inspection of Step S12 can be performed within the bonding apparatus 41. Thus, it is not necessary to install an additional inspection device outside the bonding apparatus 41. This reduces the manufacturing cost of the apparatus. Furthermore, since the inspection of Step S12 is performed prior to bonding the upper wafer $W_U$ and the lower wafer $W_L$, it is possible to feed back the inspection result to a subsequent bonding process at an appropriate timing. This enhances the accuracy of the bonding process.

The bonding system 1 according to this embodiment includes, in addition to the bonding apparatus 41, the surface modifying apparatus 30 configured to modify the front surfaces $W_{U1}$ and $W_{L1}$ of the wafers $W_U$ and the $W_L$ and the surface hydrophilizing apparatus 40 configured to hydrophilize and clean the front surfaces $W_{U1}$ and $W_{L1}$, which makes it possible to efficiently perform the bonding of the wafers $W_U$ and the $W_L$ within a single system. This improves throughput of the wafer bonding process.

While in the above embodiments, the adjustment of the horizontal positions of the upper wafer $W_U$ and the lower wafer $W_L$ at Step S11 and the inspection of the state of the lower wafer $W_L$ at Step S12 has been described to be sequentially performed, these operations may be performed in parallel.

At step S11, the position adjusting points B1, B2 and B3 of the lower wafer $W_L$ are imaged and the positions thereof are measured. Furthermore, in this embodiment, the position adjusting points A1, A2 and A3 and the position adjusting points B1, B2 and B3 constitute the reference points of the present disclosure. In the following descriptions, the position adjusting points B1, B2 and B3 will be referred to as reference points B1, B2 and B3.

At Step S12, the reference points B1, B2 and B3 measured at Step S11 are used. That is to say, the state of the lower wafer $W_L$ is inspected by comparing the measurement result of the reference points B1, B2 and B3 with a predetermined permissible range.

Such an embodiment has the same effect as the above embodiments. In addition, there is no need to image the reference points of the lower wafer $W_L$ again at Step S12. This improves throughput of the bonding process.

However, in this case, since the number of the reference points of the lower wafer $W_L$ used at Step S12 becomes smaller, the inspection accuracy of the state of the lower wafer $W_L$ is reduced. For that reason, when the inspection accuracy is required, for example, when the first lower wafer $W_L$ of one lot is inspected, it is preferable to use a multiple number of reference points as described in the above embodiments.

Figure 21:
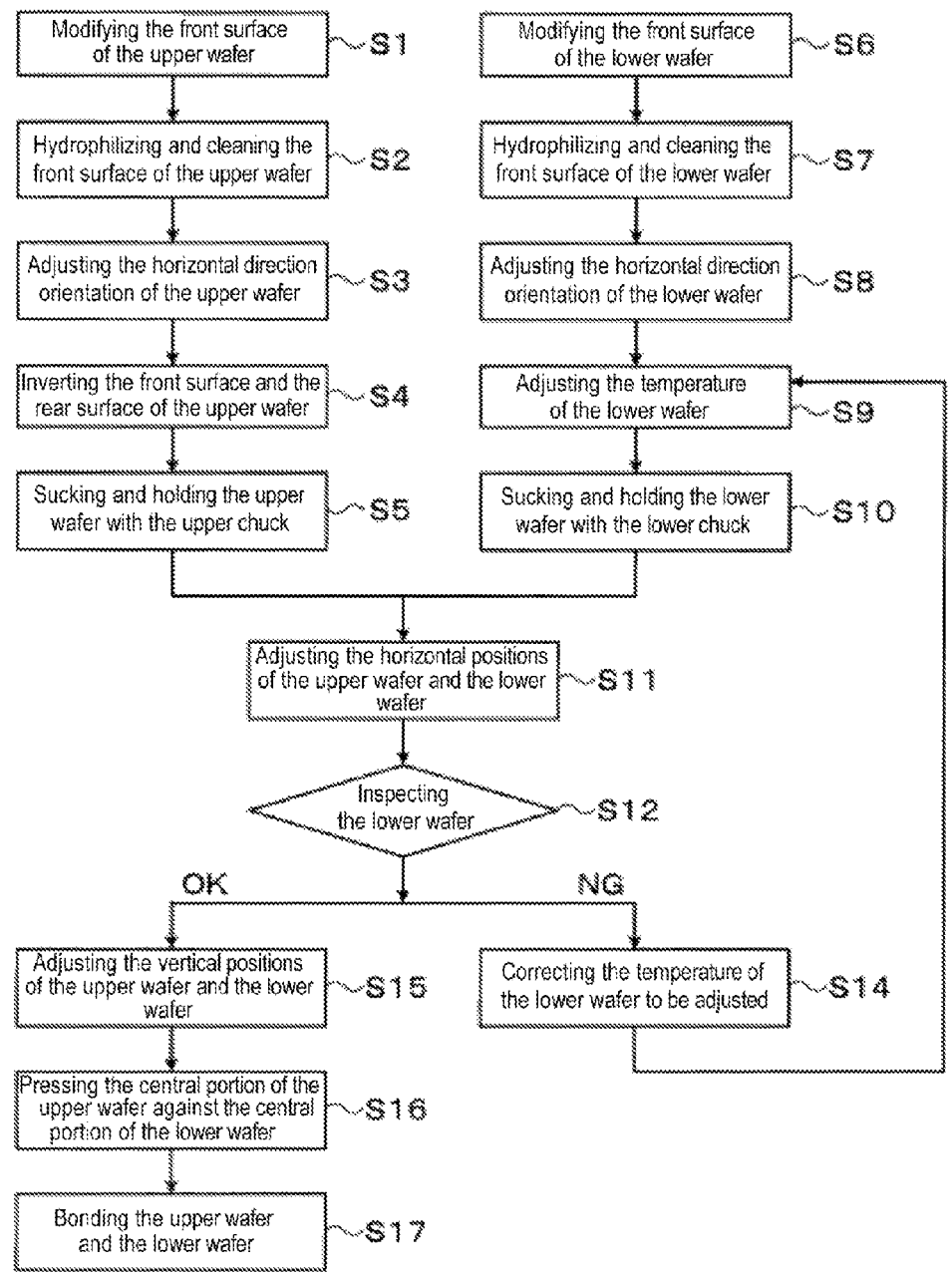
FIG. 21 is a flowchart showing main operations of a wafer bonding process according to another embodiment.

In the above embodiments, if the inspection result of the state of the lower wafer WL at Step S12 is abnormal, the upper wafer $W_U$ and the lower wafer $W_L$ has been described to be recovered at Step S13. In some embodiments, as shown in FIG. 21, the lower wafer $W_L$ determined to be abnormal may be subjected to the temperature adjustment again at Step S9.

That is to say, if the lower wafer $W_L$ is determined to be abnormal at the inspection of Step S12, the lower wafer $W_L$ is transferred to the temperature adjusting part 120. At Step S14, the temperature of the lower wafer $W_L$ to be adjusted by the temperature adjusting part 120 is corrected. Subsequently, the lower wafer $W_L$ is mounted on the temperature adjusting plate 121 of the temperature adjusting part 120 where the temperature of the lower wafer $W_L$ is adjusted to the corrected temperature. The subsequent steps following Step S10 are the same as those of the above embodiments.

With this configuration, the lower wafer $W_L$ determined to be abnormal can be reused, thus using the upper wafer $W_U$ and the lower wafer $W_L$ without waste. This improves a product yield.

While in the above embodiment, only the temperature of the lower wafer $W_L$ has been described to be adjusted in the bonding apparatus 41, the temperature of the upper wafer $W_U$ may be adjusted. In this case, an additional temperature adjusting part for adjusting the temperature of the upper wafer $W_U$ may be installed. In this case, the diameter of the lower wafer $W_L$ not yet bonded is made larger than the diameter of the upper wafer $W_U$ using a difference between the temperature of the upper wafer $W_U$ and the temperature of the lower wafer $W_L$. By controlling the temperatures of both the upper wafer $W_U$ and the lower wafer $W_L$ in this way, it is possible to further suppress the scaling and to enhance the accuracy of the bonding process.

While in the bonding apparatus 41 according to the above embodiments, the upper chuck 160 has been described to be fixed to the processing vessel 100 and the lower chuck 161 has been described to be moved in the horizontal directions and the vertical direction, the upper chuck 160 may be moved in the horizontal directions and the vertical direction and the lower chuck 161 may be fixed to the processing vessel 100. Alternatively, both the upper chuck 160 and the lower chuck 161 may be moved in the horizontal directions and the vertical direction. However, if the upper chuck 160 is moved, a respective moving mechanism becomes larger in scale. Therefore, it is preferred that the upper chuck 160 is fixed to the processing vessel 100 as in the above embodiments.

In some embodiments, in the bonding system 1 of the above embodiments, after the wafers $W_U$ and the $W_L$ are bonded by the bonding apparatus 41, the overlapped wafer $W_T$ thus bonded may be heated (annealed) to a predetermined temperature. This makes it possible to strongly join a bonding interface.

According to the present disclosure in some embodiments, it is possible to properly inspect and adjust horizontal positions of substrates to be bonded to each other, thus properly and efficiently performing a substrate bonding process.

While certain embodiments of the present disclosure have been described with reference to the accompanying drawings, the present disclosure is not limited to these embodiments. It will be apparent to those skilled in the art that different modifications and changes may be conceived without departing from the scope of the idea recited in the claims. It is to be understood that these modifications and changes may well belong to the technical scope of the present disclosure. The present disclosure is not limited to these examples and may employ many different forms. The present disclosure may be applied to other various substrates including a FPD (Flat Panel Display), a mask reticle for photomask and the like in addition to the wafers.

What is claimed is:

1. A method of bonding substrates to each other, comprising:
    a first holding operation of holding a first substrate on a lower surface of a first holding part;
    a temperature adjusting operation of adjusting a temperature of a second substrate by a temperature adjusting part to become higher than a temperature of the first substrate;
    a second holding operation of holding the second substrate temperature-adjusted at the temperature adjusting operation on an upper surface of a second holding part;
    an inspecting operation of inspecting a state of the second substrate by imaging a plurality of reference points of the second substrate held in the second holding part with a first imaging part, measuring positions of the reference points, and comparing a measurement result with a predetermined permissible range; and
    a bonding operation of, if the state of the second substrate is determined to be normal at the inspecting operation, pressing a central portion of the first substrate with a pressing member, bringing the central portion of the first substrate into contact with a central portion of the second substrate, and sequentially bonding the first substrate and the second substrate from the central portion of the first substrate toward an outer peripheral portion thereof.

2. The method of claim 1, further comprising: after the first holding operation and the second holding operation and before the inspecting operation, a position adjusting operation,
    wherein the position adjusting operation includes:
    imaging a plurality of position adjusting points of the first substrate with a second imaging part;
    imaging a plurality of position adjusting points of the second substrate with the first imaging part;
    moving the first holding part and the second holding part relative to each other in a horizontal direction by a moving part based on imaging results; and
    adjusting horizontal positions of the first substrate and the second substrate.

3. The method of claim 1, further comprising: after the first holding operation and the second holding operation, a position adjusting operation,
    wherein the position adjusting operation includes:
    imaging a plurality of reference points of the first substrate with a second imaging part;
    imaging a plurality of reference points of the second substrate with the first imaging part;

moving the first holding part and the second holding part relative to each other in a horizontal direction by a moving part based on imaging results; and adjusting horizontal positions of the first substrate and the second substrate, wherein the inspecting operation is performed using the imaging result of the reference points of the second substrate obtained in the position adjusting operation, and wherein the position adjusting operation and the inspecting operation are performed in parallel.

4. The method of claim 1, wherein, if the state of the second substrate is determined to be abnormal at the inspecting operation, the temperature of the second substrate adjusted by the temperature adjusting part at the temperature adjusting operation is corrected based on the measurement result of the positions of the reference points of the second substrate obtained at the inspecting operation.

5. The method of claim 4, wherein, if the state of the second substrate is determined to be abnormal at the inspecting operation, the second substrate is subjected to the temperature adjusting operation again at the corrected temperature.

6. A non-transitory computer-readable storage medium storing a program which, when executed by a computer of a control part that controls a bonding apparatus, causes the bonding apparatus to perform the bonding method of claim 1.

7. An apparatus of bonding substrates to each other, comprising:

a first holding part configured to hold a first substrate on a lower surface thereof;

a second holding part installed below the first holding part and configured to hold a second substrate on an upper surface thereof;

a pressing member installed in the first holding part and configured to press a central portion of the first substrate;

a temperature adjusting part configured to adjust a temperature of the second substrate;

a first imaging part configured to image the second substrate held by the second holding part; and a control part configured to control the first holding part, the second holding part, the pressing member, the temperature adjusting part and the first imaging part so as to perform: a first holding operation of holding the first substrate on the lower surface of the first holding part; a temperature adjusting operation of adjusting the temperature of the second substrate by the temperature adjusting part to become higher than a temperature of the first substrate; a second holding operation of holding the second substrate temperature-adjusted at the temperature adjusting operation on the upper surface of the second holding part; an inspecting operation of inspecting a state of the second substrate by imaging a plurality of reference points of the second substrate held in the second holding part with the first imaging part; measuring positions of the reference points and comparing a measurement result with a predetermined permissible range; and a bonding operation of, if the state of the second substrate is determined to be normal at the inspecting operation, pressing the central portion of the first substrate with the pressing member, bringing the central portion of the first substrate into contact with a central portion of the second substrate and sequentially bonding the first substrate and the second substrate from the central portion of the first substrate toward an outer peripheral portion thereof.

8. The apparatus of claim 7, further comprising:

a second imaging part configured to image the first substrate held by the first holding part; and a moving part configured to move the first holding part and the second holding part relative to each other in a horizontal direction, wherein the control part is configured to control the first imaging part, the second imaging part and the moving part so as to, after the first holding operation and the second holding operation and before the inspecting operation; image a plurality of position adjusting points of the first substrate with the second imaging part; image a plurality of position adjusting points of the second substrate with the first imaging part; move the first holding part and the second holding part relative to each other in the horizontal direction by the moving part based on imaging results; and adjust horizontal positions of the first substrate and the second substrate.

9. The apparatus of claim 7, further comprising:

a second imaging part configured to image the first substrate held by the first holding part; and a moving part configured to move the first holding part and the second holding part relative to each other in a horizontal direction, wherein the control part is configured to control the first imaging part, the second imaging part and the moving part so as to, after the first holding operation and the second holding operation, further perform a position adjusting operation of: imaging a plurality of reference points of the first substrate with the second imaging part; imaging a plurality of reference points of the second substrate with the first imaging part; moving the first holding part and the second holding part relative to each other in the horizontal direction by the moving part based on imaging results; and adjusting horizontal positions of the first substrate and the second substrate, the inspecting operation is performed based on the imaging result of the reference points of the second substrate obtained in the position adjusting operation, and the position adjusting operation and the inspecting operation are performed in parallel.

10. The apparatus of claim 7, wherein the control part is configured to, if the state of the second substrate is determined to be abnormal at the inspecting operation, correct the temperature of the second substrate adjusted by the temperature adjusting part at the temperature adjusting operation, based on the measurement result of the positions of the reference points of the second substrate obtained at the inspecting operation.

11. The apparatus of claim 10, wherein the control part is configured to, if the state of the second substrate is determined to be abnormal at the inspecting operation, control the temperature adjusting part so as to subject the second substrate to the temperature adjusting operation again at the corrected temperature.

12. A bonding system provided with a bonding apparatus of claim 7, comprising:

a processing station including the bonding apparatus; and a carry-in/carry-out station configured to hold a plurality of first substrates, a plurality of second substrates or a plurality of overlapped substrates each of which obtained by bonding the first substrate and the second substrate and configured to carry the first substrates, the second substrates or the overlapped substrates into and out of the processing station, wherein the processing station includes:
a surface modifying apparatus configured to modify a front surface of the first substrate or a front surface of the second substrate;
a surface hydrophilizing apparatus configured to hydrophilize the front surface of the first substrate or the front surface of the second substrate modified in the surface modifying apparatus; and
a transfer device configured to transfer the first substrate, the second substrate or the overlapped surface between the surface modifying apparatus, the surface hydrophilizing apparatus and the bonding apparatus,
wherein the bonding apparatus bonds the first substrate and the second substrate whose front surfaces are hydrophilized by the surface hydrophilizing apparatus.

* * * * *